United States Patent
Nakamura

(10) Patent No.: US 11,869,914 B2
(45) Date of Patent: *Jan. 9, 2024

(54) IMAGE SENSOR AND METHOD FOR MANUFACTURING IMAGE SENSOR

(71) Applicant: SONY SEMICONDUCTOR SOLUTIONS CORPORATION, Kanagawa (JP)

(72) Inventor: Yuta Nakamura, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 160 days.

This patent is subject to a terminal disclaimer.

(21) Appl. No.: 17/488,817

(22) Filed: Sep. 29, 2021

(65) Prior Publication Data

US 2022/0020802 A1 Jan. 20, 2022

Related U.S. Application Data

(63) Continuation of application No. 16/478,597, filed as application No. PCT/JP2018/007769 on Mar. 1, 2018, now Pat. No. 11,164,901.

(30) Foreign Application Priority Data

May 18, 2017 (JP) .................. 2017-098622

(51) Int. Cl.
*H01L 27/146* (2006.01)
*G02B 5/30* (2006.01)

(52) U.S. Cl.
CPC ...... *H01L 27/14629* (2013.01); *G02B 5/3058* (2013.01); *H01L 27/14609* (2013.01);
(Continued)

(58) Field of Classification Search
CPC .............. H01L 27/14629; H01L 27/14609
See application file for complete search history.

(56) References Cited

U.S. PATENT DOCUMENTS 11,164,901 B2 * 11/2021 Nakamura ........... G02B 5/3058
2008/0030734 A1   2/2008 Suehara et al.
(Continued)

FOREIGN PATENT DOCUMENTS

CN     101887900 A    11/2010
CN     102402106 A     4/2012
(Continued)

OTHER PUBLICATIONS

International Search Report and Written Opinion for International (PCT) Patent Application No. PCT/JP2018/007769, dated Jun. 13, 2018, 7 pages.

(Continued)

*Primary Examiner* — Thao P Le
(74) *Attorney, Agent, or Firm* — SHERIDAN ROSS P.C.

(57) ABSTRACT

There is provided an image sensor including: a light polarizing unit configured to transmit light in a specific light polarization direction out of incident light; a pixel configured to generate an image signal corresponding to the light transmitted through the light polarizing unit; and a signal transfer unit formed simultaneously with the light polarizing unit and configured to transfer either of the image signal and a control signal that controls generation of the image signal.

20 Claims, 18 Drawing Sheets

(52) U.S. Cl.
CPC .. *H01L 27/14621* (2013.01); *H01L 27/14636* (2013.01); *H01L 27/14685* (2013.01)

(56) References Cited

U.S. PATENT DOCUMENTS

| | | |
|---|---|---|
| 2010/0282945 A1 | 11/2010 | Yokogawa |
| 2014/0253756 A1 | 9/2014 | Yokogawa |
| 2016/0190193 A1 | 6/2016 | Yokogawa |
| 2017/0221949 A1 | 8/2017 | Yokogawa |
| 2021/0320218 A1* | 10/2021 | Imoto ............... H01L 31/02327 |
| 2021/0366961 A1* | 11/2021 | Yanagita ........... H01L 27/14621 |
| 2022/0279113 A1* | 9/2022 | Yoshimura ........... H04N 25/615 |
| 2023/0031081 A1* | 2/2023 | Akiyama ................. H04N 9/03 |
| 2023/0039270 A1* | 2/2023 | Niwa ................... H04N 25/707 |
| 2023/0103995 A1* | 4/2023 | Takahashi ................ G09F 9/30 257/40 |

FOREIGN PATENT DOCUMENTS

| | | |
|---|---|---|
| JP | 2011-176525 | 9/2011 |
| JP | 2012-142501 | 7/2012 |
| JP | 2013-102322 | 5/2013 |
| WO | WO 2016/199594 | 12/2016 |
| WO | WO 2017/018258 | 2/2017 |

OTHER PUBLICATIONS

Official Action (with English translation) for Japanese Patent Application No. 2017-098622, dated Dec. 15, 2020, 11 pages.

Official Action for U.S. Appl. No. 16/478,597, dated Sep. 29, 2020, 6 pages. Restriction Requirement.

Official Action for U.S. Appl. No. 16/478,597, dated Jan. 25, 2021, 10 pages.

Notice of Allowance for U.S. Appl. No. 16/478,597, dated Jul. 1, 2021, 9 pages.

* cited by examiner c d e f

IMAGE SENSOR AND METHOD FOR MANUFACTURING IMAGE SENSOR

CROSS REFERENCE TO RELATED APPLICATIONS

This application is continuation of and claims priority to U.S. application Ser. No. 16/478,597, filed Jul. 17, 2019, which is a national stage application under 35 U.S.C. 371 and claims the benefit of PCT Application No. PCT/JP2018/007769 having an international filing date of Mar. 1, 2018, which designated the United States, which PCT application claimed the benefit of Japanese Priority Patent Application No. 2017-098622 filed on May 18, 2017, the disclosures of each of which are incorporated herein by reference.

TECHNICAL FIELD

The present technology relates to an image sensor. Specifically, the present technology relates to an image sensor including a light polarizing unit that transmits light in a specific light polarization direction and a method for manufacturing the image sensor.

BACKGROUND ART

Thus far, an image sensor in which light polarization information of incident light is acquired by placing, for each pixel, a light polarizing unit that transmits light in a specific light polarization direction and performing photoelectric conversion has been used. By acquiring the light polarization information, the three-dimensional shape of the object can be easily grasped, for example. This is because the reflected light from the object is polarized in directions different between surfaces of the object, and therefore the shape of the surface of the object can be easily acquired by performing imaging while selecting light polarization directions. Further, an image sensor used for a monitoring device or the like can be used in order to remove an image appearing on a windshield of a vehicle undesirably. This is because the image appearing on the windshield of the vehicle undesirably is strongly optically polarized in a specific direction, and can be easily removed by acquiring light polarization information. A light polarizing unit configured with a wire grid is used as such a light polarizing unit. This is a light polarizing unit configured with a plurality of lines arranged with a pitch narrower than the wavelength of incident light.

As a method for manufacturing an image sensor including such a light polarizing unit, for example, a method for manufacturing an image sensor in which a light polarizing unit is formed on a support substrate, then the light polarizing unit on the support substrate is transferred to an upper portion of a photoelectric conversion unit that performs photoelectric conversion, and thereby a light polarizing unit is formed is used. In this manufacturing method, an oxide film is formed on the surfaces of the photoelectric conversion unit and the light polarizing unit and these oxide films are stuck together, and thereby the photoelectric conversion unit and the support substrate are adhered together. After that, the support substrate is removed, and thereby an image sensor including a light polarizing unit is formed (e.g., see PTL 1).

CITATION LIST

Patent Literature

[PTL 1]
JP 2012-142501A

SUMMARY

Technical Problem

The existing technology described above has a problem that the manufacturing process is complicated because a light polarizing unit formed on a different substrate is transferred to a photoelectric conversion unit.

Thus, it is desirable to simplify the manufacturing process of an image sensor including a light polarizing unit that transmits light in a specific light polarization direction.

Solution to Problem

According to an embodiment of the present technology, there is provided an image sensor, comprising: a plurality of pixels, each pixel including: a photoelectric conversion unit; a light polarizing unit; a pixel circuit; and a plurality of signal transfer units, wherein at least a portion of the light polarizing unit and at least a portion of the signal transfer units are at a same layer of the image sensor.

According to another embodiment of the present technology, there is provided an image sensor, comprising: a substrate; a photoelectric conversion unit formed in the substrate; a light polarizing unit on a light incident side of the substrate; and a signal transfer unit on the light incident side of the substrate, wherein the light polarizing unit and the photoelectric conversion unit are formed at a same layer of the image sensor.

According to still another embodiment of the present technology, there is provided a method of forming an image sensor, comprising: providing a substrate; forming a first flattening film on a light incident side of the substrate; forming a light blocking material on the first flattening film; and forming a plurality of light blocking lines and at least a first signal transfer unit from the light blocking material.

Advantageous Effects of Invention

According to an embodiment of the present technology, an excellent effect of simplifying the manufacturing process of an image sensor including a light polarizing unit that transmits light in a specific light polarization direction is exhibited.

DESCRIPTION OF EMBODIMENTS

Figure 1:
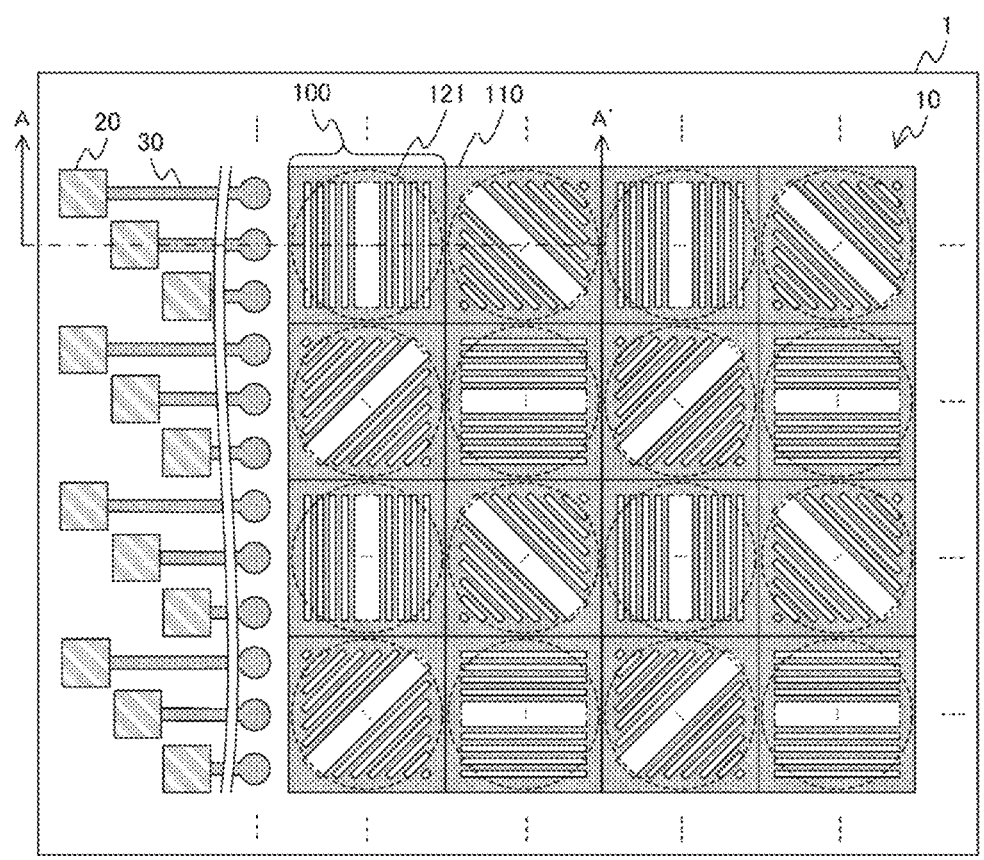
FIG. 1 is a diagram showing an example of the configuration of an image sensor according to a first embodiment of the present technology.

Next, embodiments for implementing the present technology (hereinafter, referred to as embodiments) are described with reference to the drawings. In the following drawings, identical or similar portions are marked with identical or similar reference signs. However, the drawings are schematic ones, and the proportions of dimensions, etc. of portions do not necessarily coincide with the actual ones. Further, portions for which the relationships of dimensions and the proportions are different among drawings may be included in the drawings, as a matter of course. Further, the embodiments are described in the following order.

1. First Embodiment
2. Second Embodiment
3. Third Embodiment
4. Fourth Embodiment
5. Fifth Embodiment
6. Sixth Embodiment
7. Application example to endoscopic surgery system
8. Application example to mobile object 1. First Embodiment Configuration of Image Sensor FIG. 1 is a diagram showing an example of the configuration of an image sensor according to a first embodiment of the present technology. An image sensor 1 of the drawing includes a pixel array unit 10, signal transfer units 20, and interconnections 30.

The pixel array unit 10 is configured by pixels 100 being arranged in a two-dimensional lattice form. Here, the pixel 100 generates an image signal corresponding to the applied light. As described later, the pixel 100 includes a photoelectric conversion unit that generates a charge corresponding to the applied light. Further, the pixel 100 further includes a pixel circuit. The pixel circuit generates an image signal based on the charge generated by the photoelectric conversion unit. The generation of the image signal is controlled by a control signal inputted from the outside of the image sensor 1. The photoelectric conversion unit and the pixel circuit are formed in a semiconductor substrate. In addition, in the drawing, the circle written by the dotted line represents an on-chip lens 121. The on-chip lens 121 is a lens that is placed for each pixel 100 and forms, on the photoelectric conversion unit, an image of light incident on the pixel 100.

Further, the pixel 100 further includes a light polarizing unit 110. The light polarizing unit 110 transmits light in a specific light polarization direction. A light polarizing unit configured with a wire grid may be used as the light polarizing unit 110, for example. Here, the light polarizing unit configured with a wire grid is a light polarizing unit configured with a plurality of lines arranged with a pitch narrower than the wavelength of incident light. The plurality of lines are configured with a material having the property of absorbing or reflecting light, and perform the blocking of light. Hereinafter, the line configuring the light polarizing unit 110 is referred to as a light blocking line. The light blocking line may be configured with, for example, a metal such as aluminum (Al). By arranging a plurality of light blocking lines with a pitch narrower than the wavelength of incident light, light perpendicular to the arrangement direction of the plurality of light blocking lines can be attenuated. On the other hand, light parallel to the arrangement direction of the plurality of light blocking lines passes through the light polarizing unit 110 without being attenuated. Thus, the light polarizing unit 110 can transmit light in a specific light polarization direction.

As shown in the drawing, the plurality of light blocking lines of the light polarizing units 110 may be formed to be arranged in directions different between pixels 100. In the drawing, light polarizing units 110 of which the direction is shifted by 45 degrees between adjacent pixels 100 are formed. Thus, light polarization information of light incident on the image sensor 1 can be acquired by causing image signals to be outputted from the pixels 100 including the light polarizing units 110 arranged in different directions. In addition, the configuration of the light polarizing units 110 is not limited to this example. For example, light polarizing units 110 of a configuration in which the direction is shifted by an angle other than 45 degrees between adjacent pixels 100 are possible.

The signal transfer unit 20 transfers either of the image signal and the control signal described above. A plurality of signal transfer units 20 are arranged in a peripheral portion of the image sensor 1, and transfer a control signal inputted from the outside of the image sensor 1 to the pixel 100, and transfer an image signal generated by the pixel 100 to a processing apparatus outside the image sensor 1. A pad configured with the same metal as the light blocking line of the light polarizing unit 110 may be used as the signal transfer unit 20. As described later, the signal transfer unit 20 is formed simultaneously with the light polarizing unit 110 in the manufacturing process of the image sensor 1.

The interconnection 30 is placed between the signal transfer unit 20 and the pixel 100, and transfers signals between the signal transfer unit 20 and the pixel circuit formed in the semiconductor substrate. The interconnection 30 is placed near the light polarizing unit 110. Similarly to the signal transfer unit 20, the interconnection 30 may be configured with the same metal as the light blocking line of the light polarizing unit 110, and can be formed simultaneously with the light polarizing unit 110 in the manufacturing process of the image sensor 1.

Figure 2:
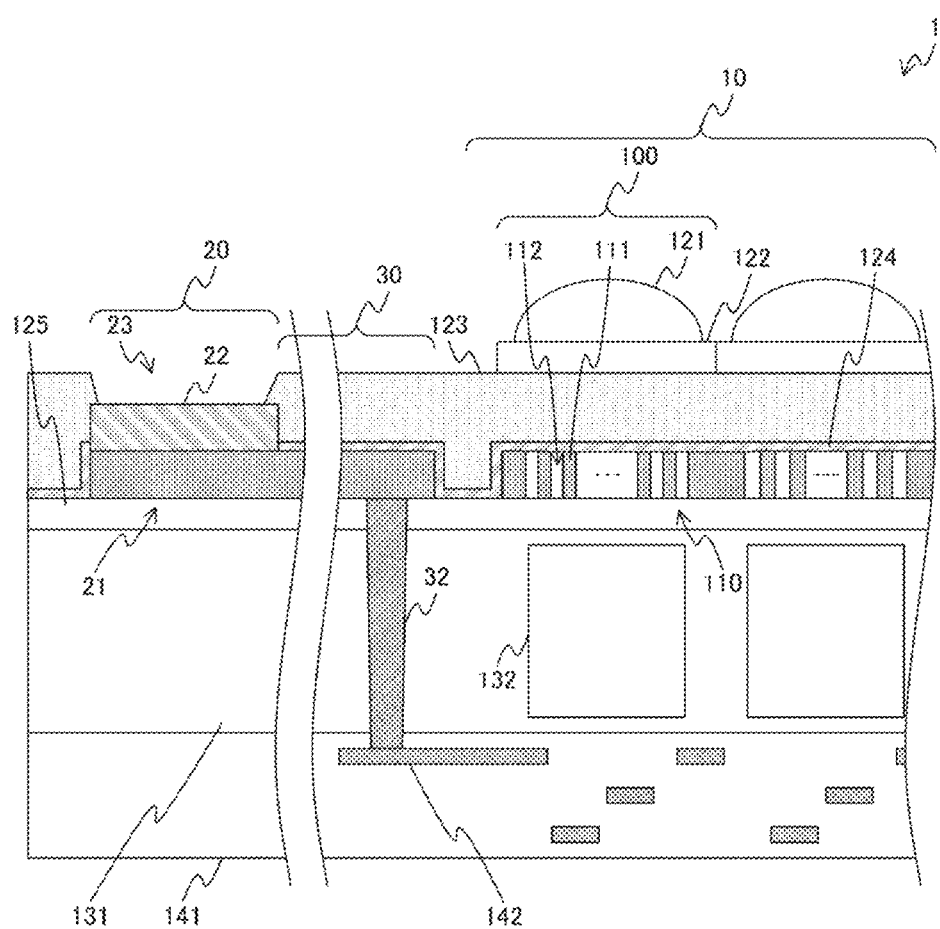
FIG. 2 is a schematic cross-sectional view showing an example of the configuration of an image sensor according to the first embodiment of the present technology.
Figure 3:
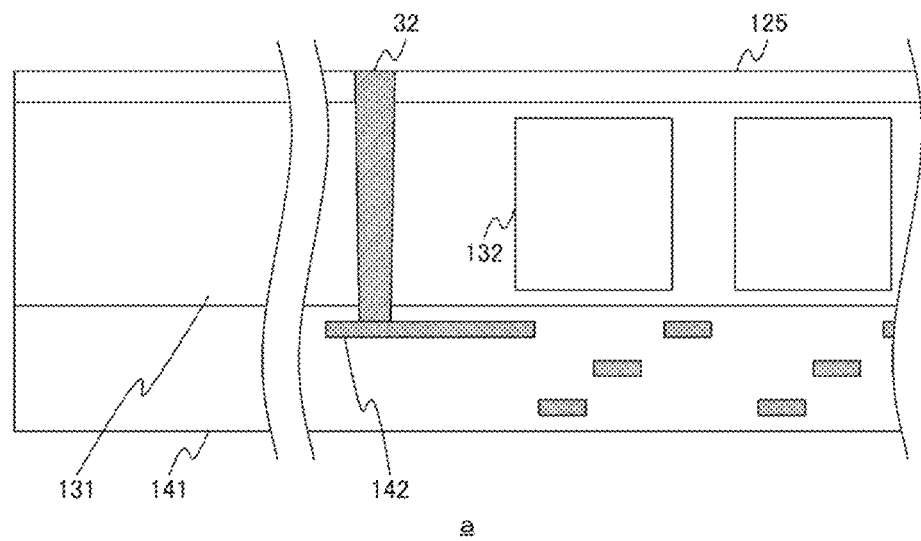
FIG. 3 is a diagram showing an example of the method for manufacturing an image sensor according to the first embodiment of the present technology.
Figure 3:
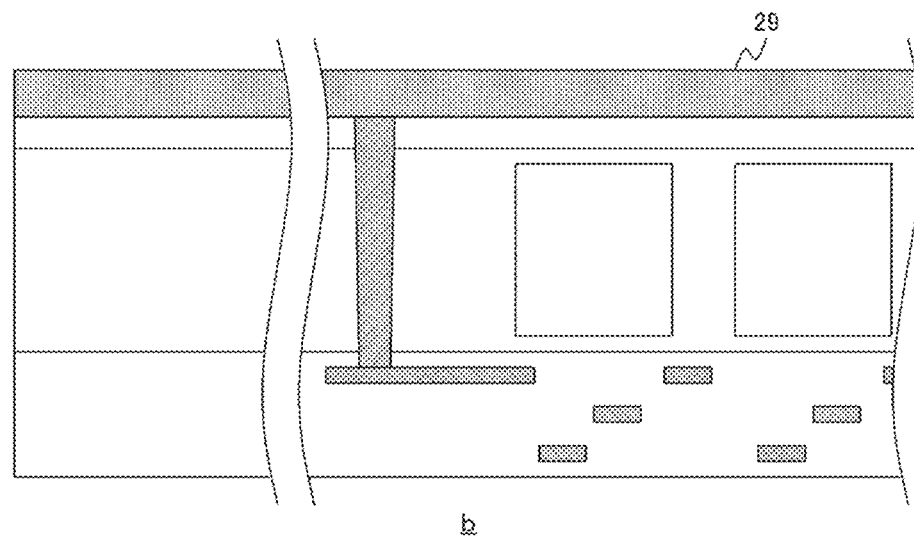
Figure 4:
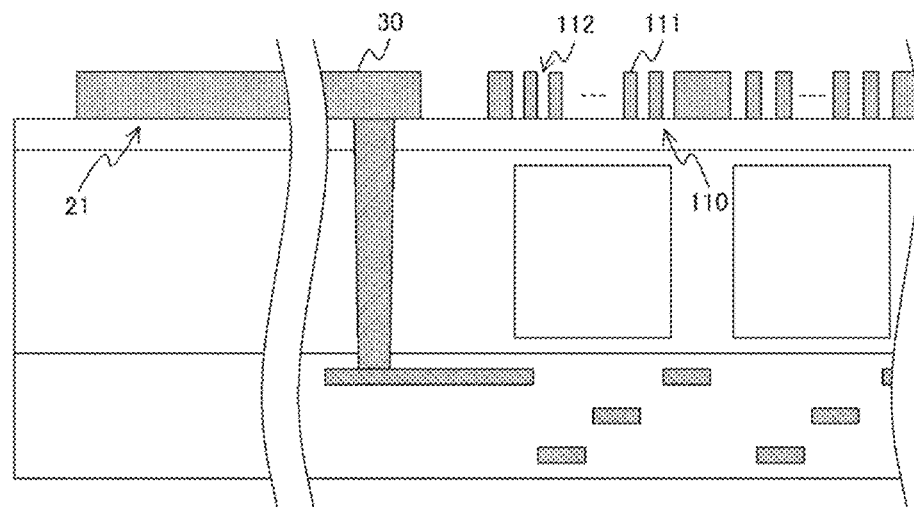
FIG. 4 is a diagram showing an example of the method for manufacturing an image sensor according to the first embodiment of the present technology.
Figure 4:
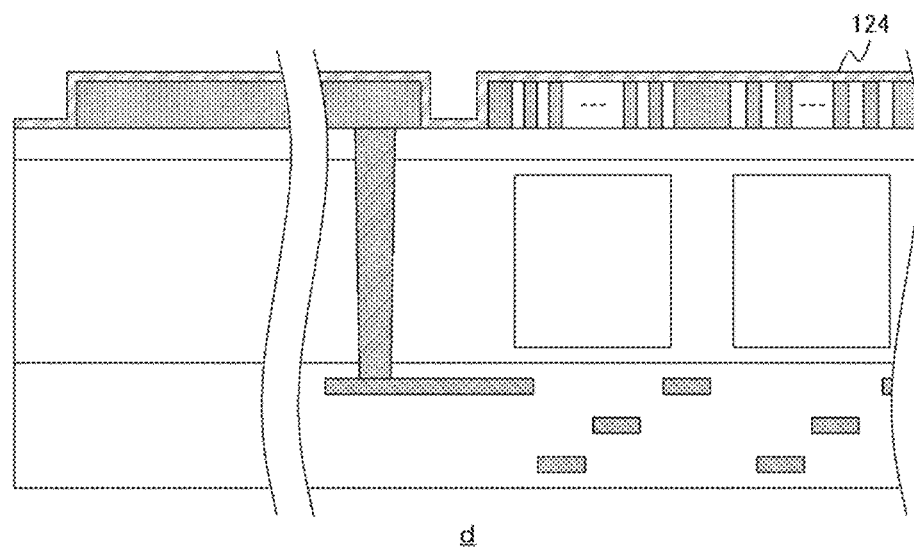
Figure 5:
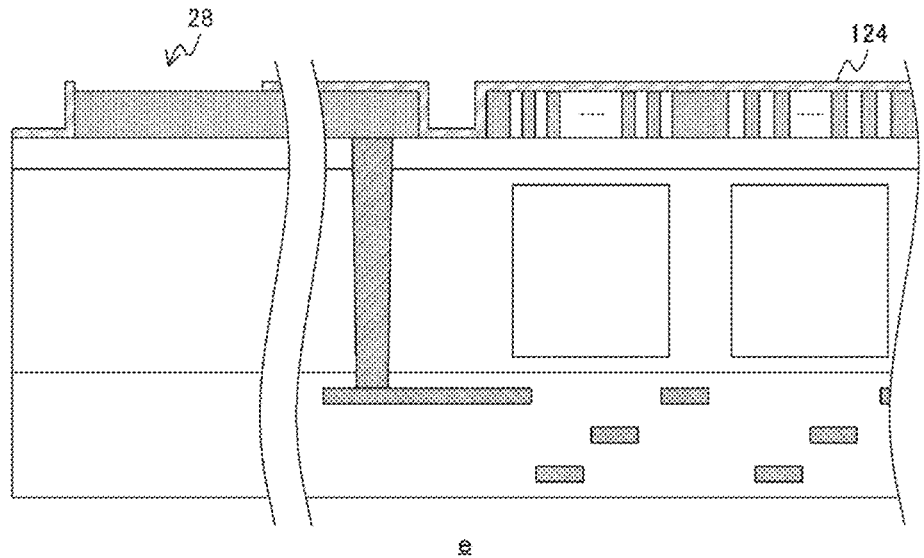
FIG. 5 is a diagram showing an example of the method for manufacturing an image sensor according to the first embodiment of the present technology.
Figure 5:
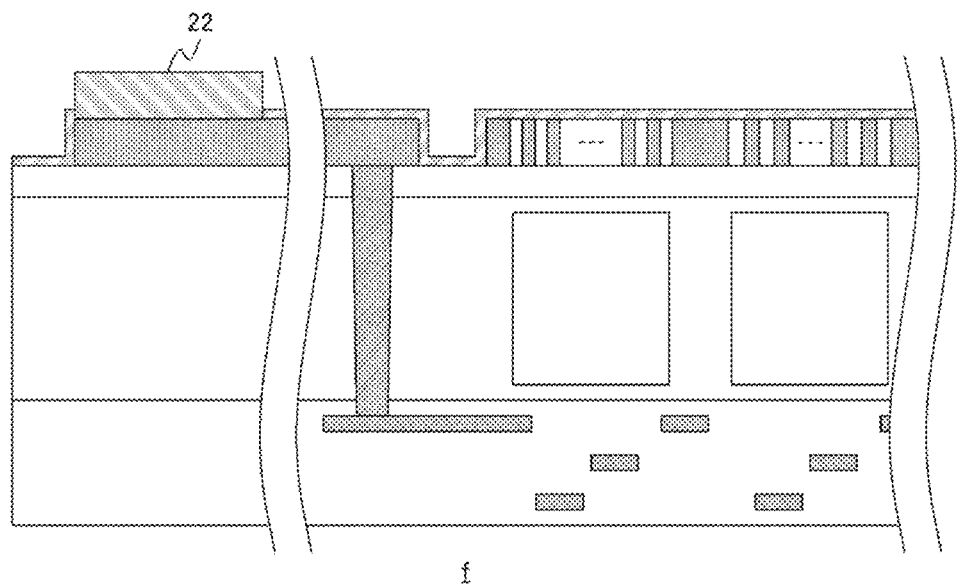

FIG. 2 is a schematic cross-sectional view showing an example of the configuration of an image sensor according to the first embodiment of the present technology. The drawing is a diagram showing a cross section of the image sensor 1 taken along line A-A' in FIG. 1. The pixel 100 of the drawing includes, in addition to the on-chip lens 121 and the light polarizing unit 110, a color filter 122, a photoelectric conversion unit 132, an interconnection layer 142, and an insulating layer 141.

The color filter 122 is an optical filter that transmits light of a prescribed wavelength. The color filter 122 can transmit, for example, red light, green light, or blue light out of the light formed as an image by the on-chip lens 121. Pixels 100 in which color filters 122 that transmit red light, green light, and blue light are arranged may be configured in a prescribed array, such as the Bayer array. Further, a color filter 122 corresponding to light of the same wavelength may be placed in four pixels that include light polarizing units 110 of which the direction is shifted by 45 degrees between adjacent pixels 100. Specifically, it is also possible to employ a configuration in which a color filter that transmits red light, green light, or blue light is placed in pixels 100 of two rows by two columns in FIG. 1 as a unit. In addition, the color filter 122 may be a color filter that transmits another color, such as a color filter corresponding to white light that can transmit red color to blue color.

The light polarizing unit 110 of the drawing is configured by a plurality of light blocking lines 111 being arranged at equal intervals. A material of the property of transmitting light may be used for an area 112 between light blocking lines 111. In the light polarizing unit 110 of the drawing, the area 112 is filled with air. The plurality of light blocking lines 111 and the plurality of areas 112 are configured with an equal line-and-space, and transmit light in a specific light polarization direction. Further, a protection film 124 is formed on a side of the light blocking line 111 and the area 112 on which light is incident. The protection film 124 protects the light polarizing unit 110, and hermetically seals the area 112. Silicon oxide ($SiO_2$) and silicon nitride (SiN) may be used as the protection film 124. Further, a second flattening film 123 is formed between the protection film 124 and the color filter 122. $SiO_2$, an acrylic resin, or spin-on glass (SOG) may be used for the second flattening film 123.

The photoelectric conversion unit 132 is formed in a semiconductor substrate 131. The photoelectric conversion unit 132 is configured with a semiconductor of a different type from the semiconductor substrate 131. For example, the semiconductor substrate 131 and the photoelectric conversion unit 132 may be configured as a p-type semiconductor and an n-type semiconductor, respectively. If light transmitted through the light polarizing unit 110 is incident on a p-n junction area formed at the interface between the semiconductor substrate 131 and the photoelectric conversion unit 132, a charge based on photoelectric conversion is generated. Thus, the photoelectric conversion unit 132 and the semiconductor substrate 131 configure a photodiode. The charge generated by the photodiode is converted to an image signal by the pixel circuit (not illustrated) placed in the vicinity of the photoelectric conversion unit 132, and is outputted from the pixel 100. A first flattening film 125 is formed between the semiconductor substrate 131 and the light polarizing unit 110. The first flattening film 125 may be configured with $SiO_2$.

The image signal generated in the pixel 100 and the control signal that controls the pixel circuit of the pixel 100 are transferred by the interconnection layer 142. The interconnection layer 142 is formed in the interior of the insulating layer 141 that is formed adjacent to a surface of the semiconductor substrate 131 different from the surface on which light is incident. An image sensor in which light is thus applied to the photoelectric conversion unit 132 from a surface of the semiconductor substrate 131 on the back side of the surface on which the interconnection layer 142 is formed is called a back-side illumination image sensor. In addition, the interconnection layer may be configured with a metal.

The interconnection 30 of the drawing is placed on the same surface of the image sensor 1 as the light blocking line 111 of the light polarizing unit 110, and the protection film 124 is formed on the surface. Further, the interconnection 30 of the drawing extends to an area of the signal transfer unit 20, and configures a part of the signal transfer unit 20. A part of the interconnection 30 configuring a part of the signal transfer unit 20 is referred to as a first signal transfer unit 21. The interconnection 30 and the interconnection layer 142 are connected together by a via plug 32. The via plug 32 may be configured with a metal.

In addition, the interconnection 30 is formed in the vicinity of the light polarizing unit 110. As described later, the light blocking line 111 of the light polarizing unit 110 is formed by dry etching. The dry etching enables directional etching, and is therefore an etching method that can be used at the time of forming a fine pattern like the light polarizing unit 110. However, in dry etching, a phenomenon in which the etching rate varies with the roughness and fineness state of the pattern to be formed is known. This phenomenon is called as a micro-loading effect, and is a cause of failure in etching. Specifically, in an area of the light polarizing unit 110 where the light blocking line 111 is formed with a narrow pitch, the etching rate is greatly reduced as compared to other areas. Hence, a remaining balance of etching occurs in the light polarizing unit 110. Thus, the interconnection 30 is formed in the vicinity of the pixel array unit 10. Thereby, the roughness and fineness state of the area to be etched can be eased, and the occurrence of failure in etching can be prevented.

The signal transfer unit 20 of the drawing is configured by the first signal transfer unit 21 described above and a second signal transfer unit 22 placed adjacent to the first signal transfer unit 21. Further, an opening 23 is formed in the second flattening film 123 adjacent to the surface of the signal transfer unit 20. A solder ball (not illustrated) is placed on the signal transfer unit 20 facing the opening 23, for example. The image sensor 1 is, via the solder ball, connected to a processing circuit that processes an image signal and a control circuit that generates a control signal. Thus, the signal transfer unit 20 is connected to circuits outside the image sensor 1; therefore, it is necessary to improve the mechanical strength of the signal transfer unit 20. Hence, the second signal transfer unit 22 is placed to increase the film thickness of the signal transfer unit 20, and thereby the mechanical strength is improved. In addition, the protection film 124 between the first signal transfer unit 21 and the second signal transfer unit 22 is removed. This is in order to electrically connect the first signal transfer unit 21 and the second signal transfer unit 22. Further, an underlying metal used during the formation of the solder ball may be placed on the surface of the second signal transfer unit 22.

Method for Manufacturing Image Sensor

FIGS. 3 to 6 are diagrams showing an example of the method for manufacturing an image sensor according to the first embodiment of the present technology. The manufacturing process of the image sensor 1 will now be described using FIGS. 3 to 6. First, the insulating layer 141 and the interconnection layer 142 are formed on the front surface of the semiconductor substrate 131 in which diffusion layers such as the photoelectric conversion unit 132 are formed. After that, the rear surface of the semiconductor substrate 131 is polished to reduce the thickness, an insulating film and an anti-reflection film (not illustrated) are stacked, and then the first flattening film 125 is formed. After that, the via plug 32 is formed. This can be performed by forming a via hole extending from the surface of the first flattening film 125 to reach the interconnection layer 142 and placing a metal in a pillar shape in the via hole (a in FIG. 3). Next, a light blocking material 29 is formed on the surface of the first flattening film 125. Al formed by vacuum vapor deposition may be used as the light blocking material 29 (b in FIG. 3).

Next, etching is performed on the light blocking material 29 to form a plurality of light blocking lines 111 and a plurality of areas 112. In this event, also the interconnection 30 and the first signal transfer unit 21 are formed simultaneously. These can be formed by forming a resist on the light blocking material 29 and then performing dry etching (for example, reactive ion etching) to remove areas corresponding to the areas 112 (c in FIG. 4). This process corresponds to a light polarizing unit formation process. By this process, the light polarizing unit 110, the interconnection 30, and the first signal transfer unit 21 can be formed simultaneously. In this event, by placing the interconnection 30 in the vicinity of the pixel array unit 10, the micro-loading effect can be suppressed, and the occurrence of etching failure can be prevented.

Next, the protection film 124 is formed on the surfaces of the light polarizing unit 110, the interconnection 30, and the first signal transfer unit 21. This can be performed by sequentially forming $SiO_2$ and SiN (d in FIG. 4). The formation of $SiO_2$ and SiN can be performed by chemical vapor deposition (CVD).

Next, an opening 28 is formed in the protection film 124. This can be performed by dry etching (e in FIG. 5). Next, the second signal transfer unit 22 is formed in the area of the opening 28. This can be performed by forming a film of Al by vacuum vapor deposition and removing the area other than the second signal transfer unit 22 by dry etching (f in FIG. 5).

Figure 6:
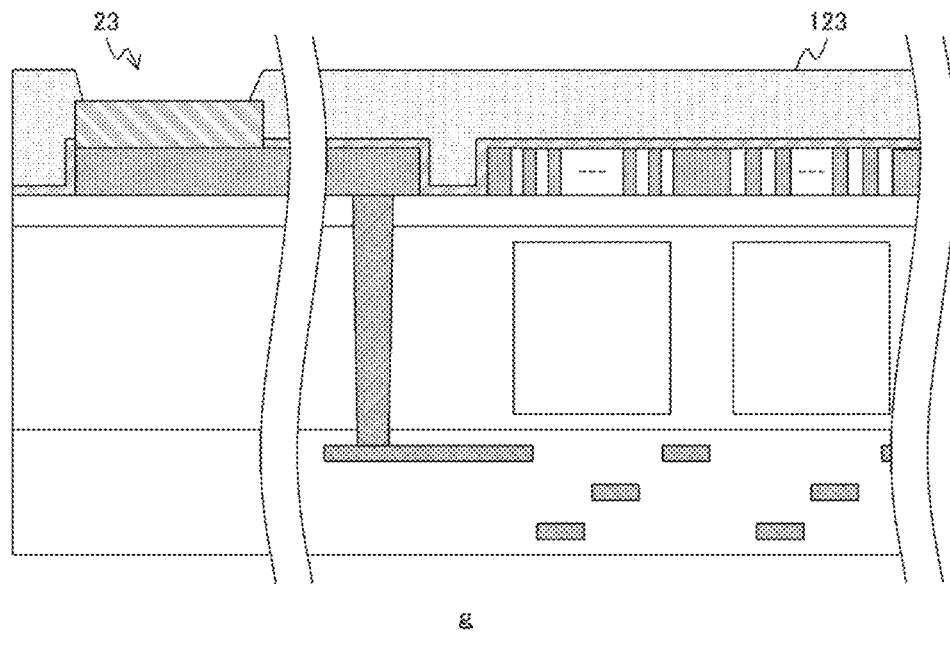
FIG. 6 is a diagram showing an example of the method for manufacturing an image sensor according to the first embodiment of the present technology.

Next, the second flattening film 123 is formed, and the opening 23 is formed (g in FIG. 6). After that, the color filter 122 and the on-chip lens 121 are formed (not illustrated). Thereby, the image sensor 1 can be manufactured.

Thus, by simultaneously forming the light blocking line 111 of the light polarizing unit 110, the interconnection 30, and the signal transfer unit 20, the manufacturing process can be simplified as compared to a case where these are formed individually.

Modification Example 1

Although in the image sensor 1 described above the pixel circuit and the signal transfer unit 20 are connected together by the interconnection 30 and the interconnection layer 142, the interconnection 30 may be omitted and the transfer of signals may be performed by the interconnection layer 142.

Figure 7:
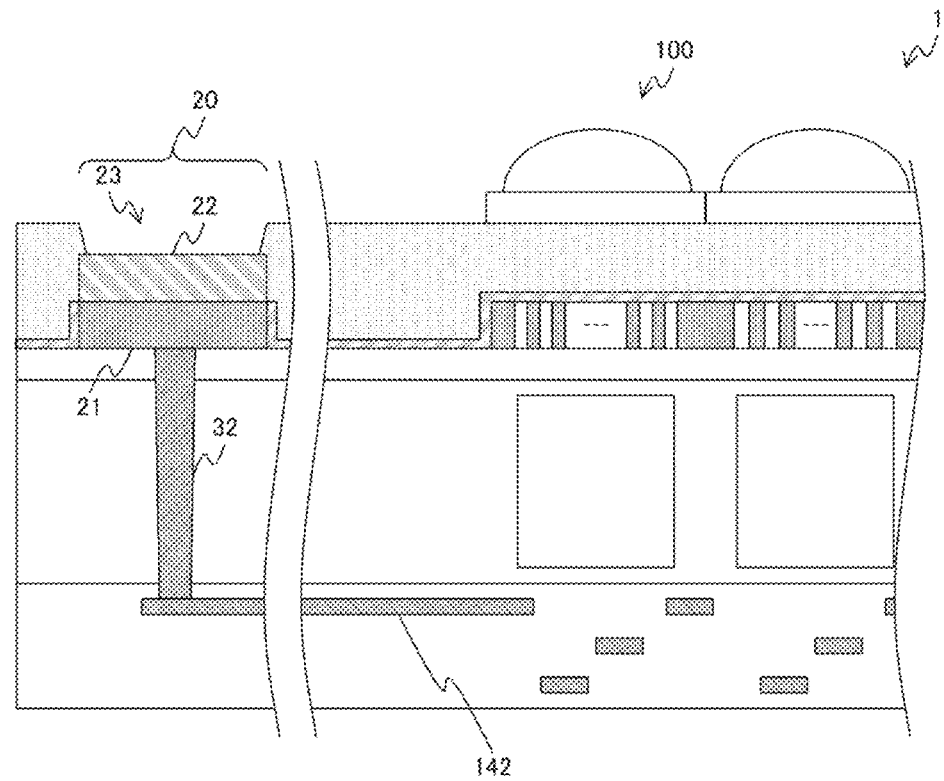
FIG. 7 is a schematic cross-sectional view showing an example of the configuration of an image sensor according to a first modification example of the first embodiment of the present technology.

FIG. 7 is a schematic cross-sectional view showing an example of the configuration of an image sensor according to a first modification example of the first embodiment of the present technology. In the image sensor 1 of the drawing, the interconnection 30 is omitted. Further, the interconnection layer 142 is extended to an area of the signal transfer unit 20, and is connected to the first signal transfer unit 21 by the via plug 32. Also in the image sensor 1 of the drawing, the manufacturing process of the image sensor 1 can be simplified by forming the first signal transfer unit 21 simultaneously with the light blocking line 111 of the light polarizing unit 110.

Modification Example 2

The image sensor 1 described above is configured such that the light polarization direction of the light polarizing unit 110 is different between adjacent pixels. In contrast, pixels 100 including light polarizing units 110 having the same light polarization direction may be arranged in two rows by two columns, and with these four pixels as a unit pixel, the light polarization direction may be differentiated between adjacent unit pixels.

Figure 8:
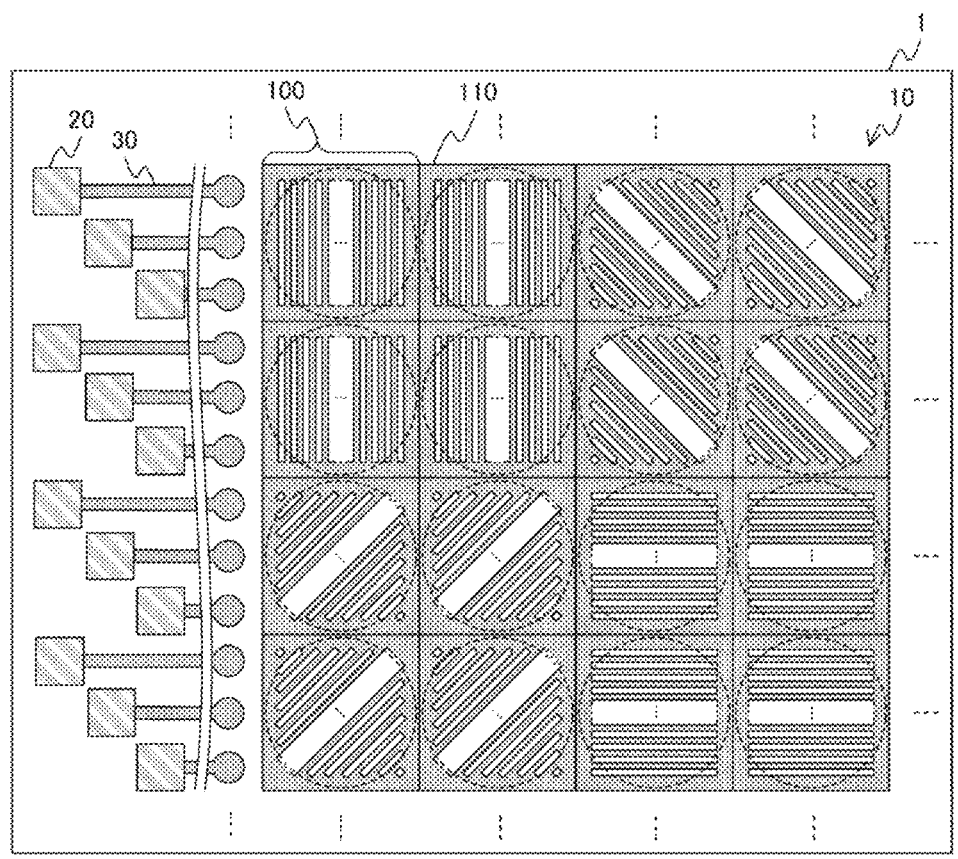
FIG. 8 is a diagram showing an example of the configuration of an image sensor according to a second modification example of the first embodiment of the present technology.

FIG. 8 is a diagram showing an example of the configuration of an image sensor according to a second modification example of the first embodiment of the present technology. The image sensor 1 of the drawing includes light polarizing units 110 of which the light polarization direction is shifted by 45 degrees between adjacent unit pixels. In this case, image signals and light polarization information of red light, green light, and blue light can be acquired for each unit pixel by setting the color filters of the unit pixel to the Bayer array configuration. In addition, the color filter may be a color filter that transmits another color, such as a color filter corresponding to white light. Further, the unit pixel may be configured in another array (for example, three rows by three columns or four rows by four columns).

In addition, the configuration of the image sensor 1 of the first embodiment of the present technology is not limited to this example. For example, it is also possible to employ a configuration in which, in FIG. 2, the second signal transfer unit 22 is omitted and signals are transferred using only the first signal transfer unit 21 as the signal transfer unit 20.

As described hereinabove, according to the first embodiment of the present technology, the manufacturing process of the image sensor 1 can be simplified by simultaneously forming the light polarizing unit 110 and the signal transfer unit 20.

2. Second Embodiment

The image sensor 1 of the first embodiment described above uses a light blocking line 111 configured with a single metal or the like. In contrast, the image sensor 1 of a second embodiment of the present technology differs from the first embodiment in that a light blocking line of a three-layer structure is used.

Configuration of Image Sensor

Figure 9:
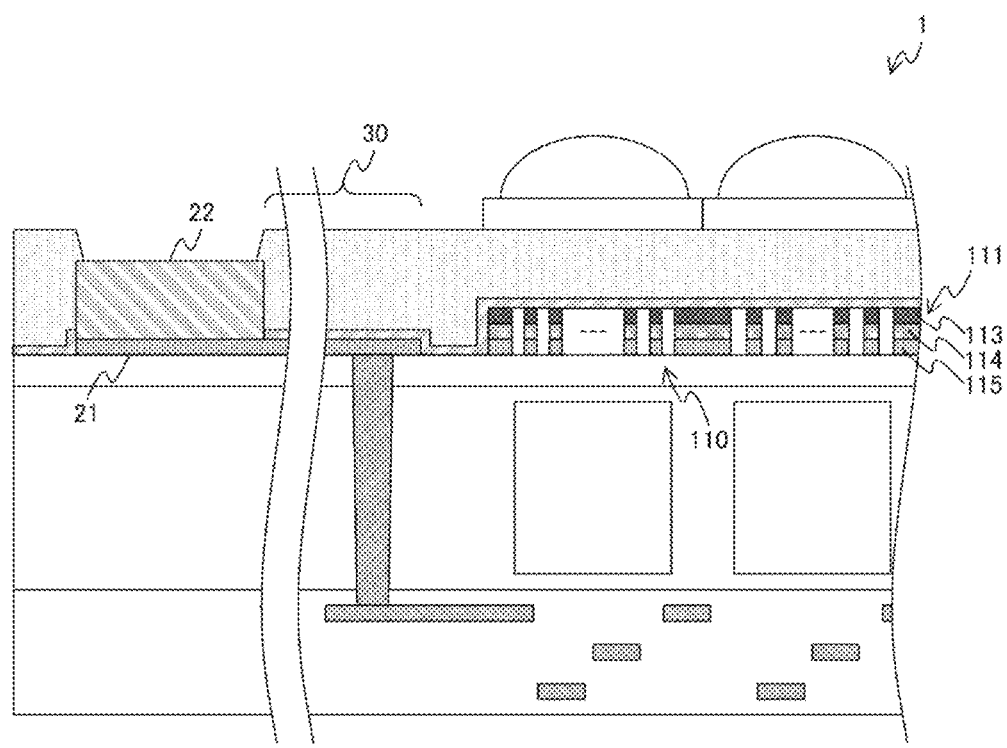
FIG. 9 is a schematic cross-sectional view showing an example of the configuration of an image sensor according to a second embodiment of the present technology.

FIG. 9 is a schematic cross-sectional view showing an example of the configuration of an image sensor according to the second embodiment of the present technology. The image sensor 1 of the drawing differs from the image sensor 1 described in FIG. 2 in that the light blocking line 111 is configured by three layers.

The light blocking line 111 of the drawing includes a light reflecting layer 115, an insulating layer 114, and a light absorbing layer 113. The light reflecting layer 115 reflects light. The light reflecting layer 115 may be configured with, for example, A1. The light absorbing layer 113 absorbs light. The light absorbing layer 113 may be configured with, for example, tungsten (W). The insulating layer 114 is a transparent insulator, and adjusts the phase of the light reflected by the light reflecting layer 115. The adjustment of the phase by the insulating layer 114 may be performed by setting the phase of the light reflected by the light reflecting layer 115 to a phase opposite to the phase of the light reflected by the light absorbing layer 113. The light of which the phase has been adjusted by the insulating layer 114 and the light reflected by the light absorbing layer 113 are in antiphase, and therefore both are attenuated by interference. Thereby, the light blocking ability by the light blocking line 111 can be improved. Further, the insulating layer 114 serves also as an underlayer of the light absorbing layer 113. The insulating layer 114 may be configured with, for example, $SiO_2$.

In the image sensor 1 of the drawing, the light reflecting layer 115, the interconnection 30, and the first signal transfer unit 21 are formed simultaneously. Thereby, the manufacturing process of the image sensor 1 can be simplified. Further, the light reflecting layer 115 is smaller in thickness than the light blocking line 111 described in FIG. 2; thus, it is desirable for the second signal transfer unit 22 to be formed thicker.

Otherwise, the configuration of the image sensor 1 is similar to the configuration of the image sensor 1 described in the first embodiment of the present technology, and therefore a description is omitted.

As described above, according to the second embodiment of the present technology, the light blocking ability of the light polarizing unit 110 can be improved by using a light blocking line 111 of a three-layer structure. Thereby, the transmission of light other than light in a desired light polarization direction can be prevented, and the accuracy of the acquired light polarization information can be improved.

3. Third Embodiment

In the image sensor 1 of the first embodiment described above, the light polarizing unit 110 and the signal transfer unit 20 are insulated. In contrast, the image sensor 1 of a third embodiment of the present technology differs from the first embodiment in that the light polarizing unit 110 and the signal transfer unit 20 are short-circuited.

Configuration of Image Sensor

Figure 10:
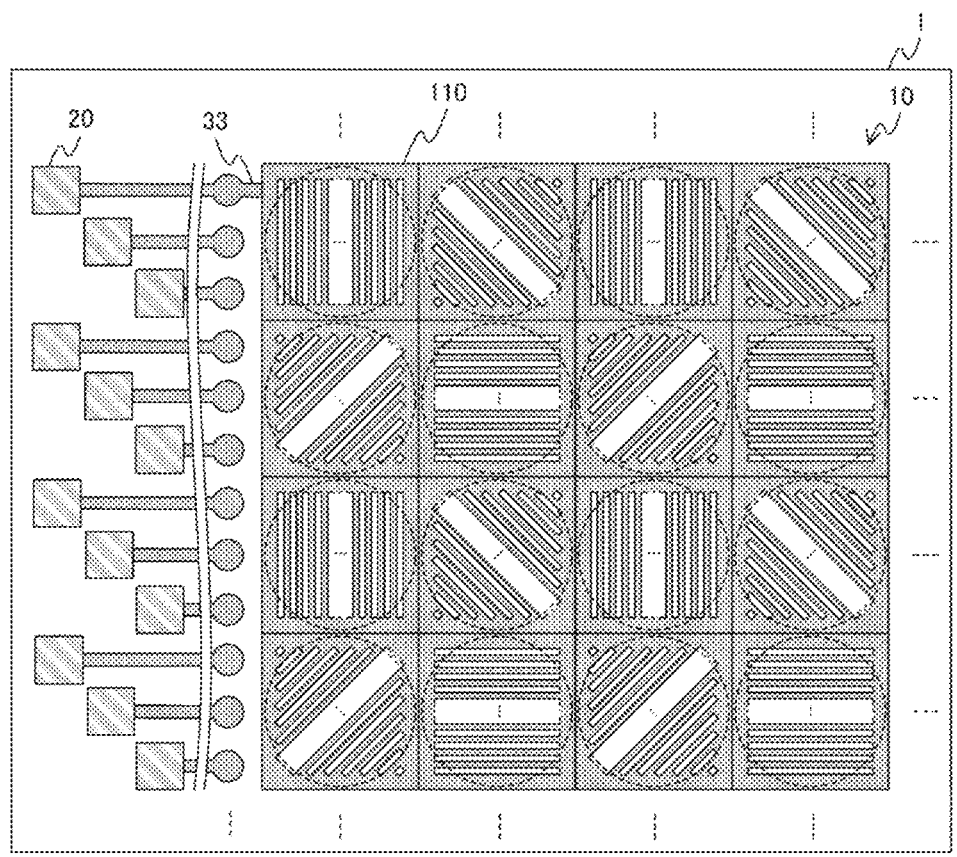
FIG. 10 is a diagram showing an example of the configuration of an image sensor according to a third embodiment of the present technology.

FIG. 10 is a diagram showing an example of the configuration of an image sensor according to the third embodiment of the present technology. The image sensor 1 of the drawing differs from the image sensor 1 described in FIG. 1 in that an interconnection 33 is included.

The interconnection 33 is an interconnection that connects the light polarizing unit 110 and the signal transfer unit 20. The interconnection 33 electrically connects the light polarizing unit 110 and the signal transfer unit 20. The interconnection 33 of the drawing is configured by one of the interconnections 30 described in FIG. 1 being connected to the light blocking line 111 of the light polarizing unit 110. The interconnection 33 may be connected to, for example, a signal transfer unit 20 connected to the ground potential. Thereby, the potential of the light blocking line 111 becomes the same potential as the signal transfer unit 20. In the manufacturing of the image sensor 1, the image sensor 1 is electrified by ionized gas produced when sputtering or the like is performed. In this event, in a case where the light polarizing unit 110 is insulated, there is a case where charges associated with the electrification are accumulated in the light polarizing unit 110 and insulation breakdown is caused, and the image sensor 1 is damaged. Thus, the interconnection 33 is placed to short-circuit the light polarizing unit 110 and the signal transfer unit 20; thereby, the accumulation of charges into the light polarizing unit 110 can be prevented, and the breaking of the image sensor 1 can be prevented. Here, the interconnection 33 is an example of a connection unit according to an embodiment of the present disclosure.

Otherwise, the configuration of the image sensor 1 is similar to the configuration of the image sensor 1 described in the first embodiment of the present technology, and therefore a description is omitted.

As described above, according to the third embodiment of the present technology, the breaking of the image sensor 1 in the manufacturing process can be prevented by placing the interconnection 33 to prevent the accumulation of charges into the light polarizing unit 110.

4. Fourth Embodiment

The image sensor 1 of the first embodiment described above uses a back-side illumination image sensor. In contrast, the image sensor 1 of a fourth embodiment of the present technology differs from the first embodiment in that a front-side illumination image sensor is used.

Configuration of Image Sensor

Figure 11:
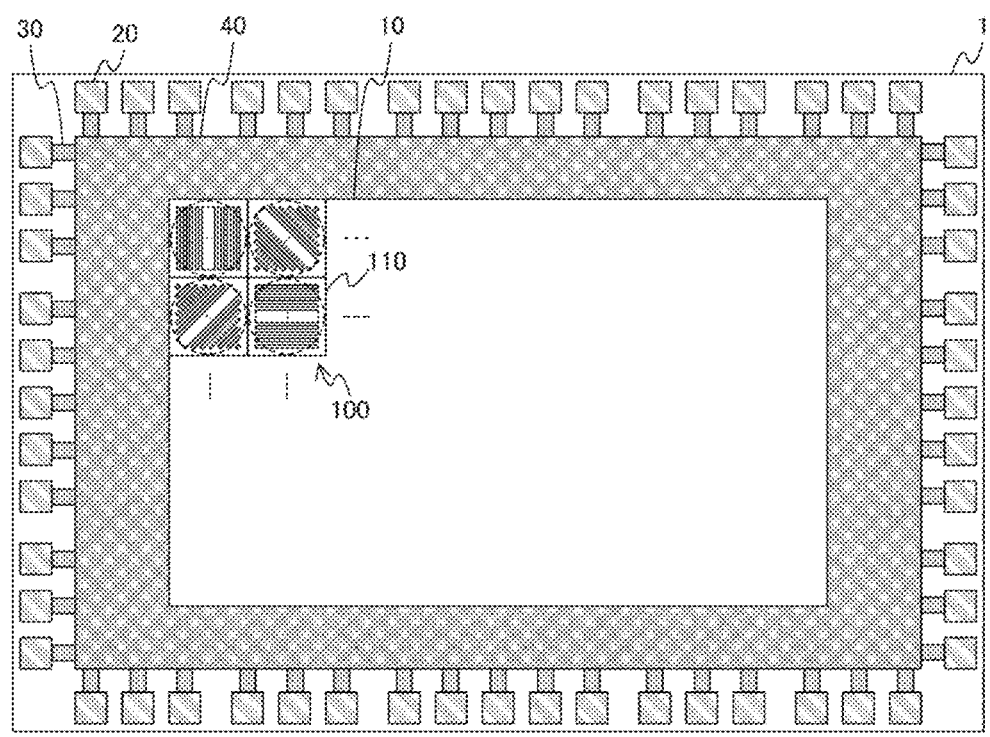
FIG. 11 is a diagram showing an example of the configuration of an image sensor according to a fourth embodiment of the present technology.

FIG. 11 is a diagram showing an example of the configuration of an image sensor according to the fourth embodiment of the present technology. The image sensor 1 of the drawing differs from the image sensor 1 described in FIG. 1 in that a peripheral circuit unit 40 is further included. The peripheral circuit unit 40 includes the processing circuit that processes an image signal and the control circuit that generates a control signal of the pixel circuit, which are described above in the first embodiment of the present technology. It is desirable for the image sensor 1 in the first embodiment of the present technology to be used while being connected to the control circuit and the processing circuit placed outside. In contrast, the image sensor 1 of the drawing is an image sensor including the processing circuit etc., and can perform the generation of a control signal and the processing of an image signal. The signal transfer unit 20 of the drawing transfers an image signal or a control signal that is passed between the processing circuit and the control circuit of the peripheral circuit unit 40, and an apparatus outside the image sensor 1, such as an image processing apparatus.

Figure 12:
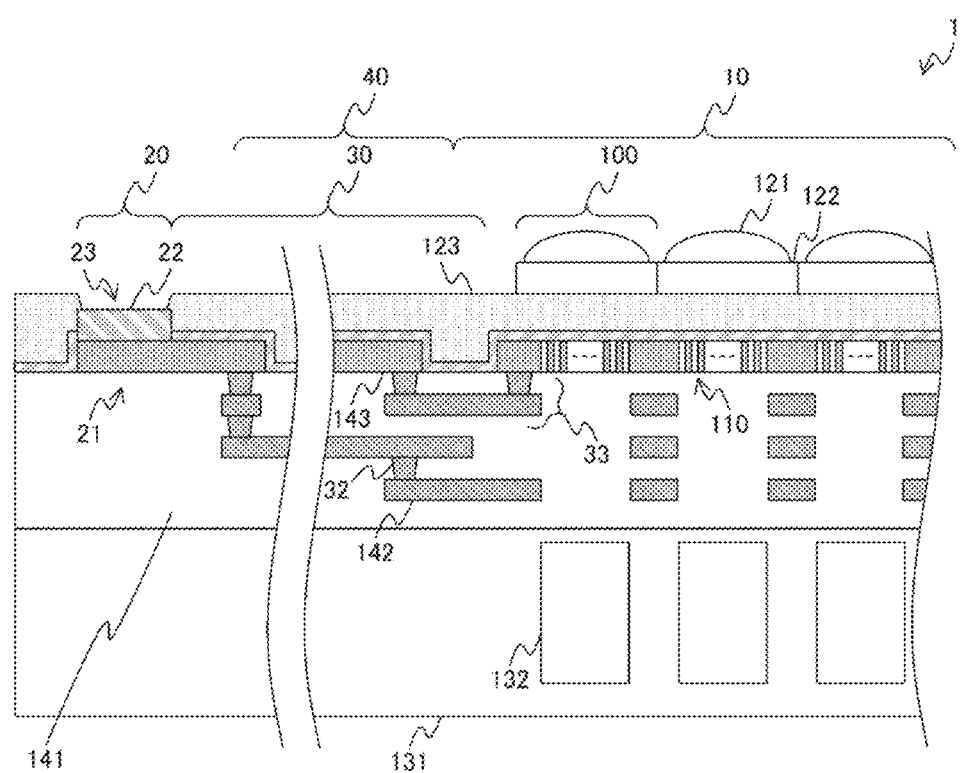
FIG. 12 is a schematic cross-sectional view showing an example of the configuration of an image sensor according to a fourth embodiment of the present technology.

FIG. 12 is a schematic cross-sectional view showing an example of the configuration of an image sensor according to the fourth embodiment of the present technology. The image sensor 1 of the drawing is configured by the insulating layer 141 and the interconnection layer 142, the light polarizing unit 110, the second flattening film 123, the color filter 122, and the on-chip lens 121 being sequentially arranged on a surface of the semiconductor substrate 131. An image sensor of such a configuration is called a front-side illumination image sensor in which light is applied to the front surface of the semiconductor substrate 131. Semiconductor elements configuring the peripheral circuit unit 40 of the drawing are formed in the semiconductor substrate 131 on the outside of the pixel array unit 10 (not illustrated), and interconnections between these semiconductor elements correspond to the interconnection layer 142 and the via plug 32 of the drawing.

Also in the image sensor 1 of the drawing, the light polarizing unit 110 and the first signal transfer unit 21 are formed simultaneously. In addition, in the image sensor 1 of the drawing, the interconnection 30 includes an interconnection layer of the peripheral circuit unit 40, and the interconnection layer of the peripheral circuit unit 40 can be placed in the same layer as the light polarizing unit 110. An interconnection layer 143 of the drawing corresponds to a part of the interconnection of the peripheral circuit unit 40 placed in the same layer as the light polarizing unit 110. Also the interconnection layer 143 can be formed simultaneously with the light polarizing unit 110 and the first signal transfer unit 21. Thereby, the manufacturing process of the image sensor 1 configured as a front-side illumination type can be simplified. Further, the roughness and fineness state of the area to be etched during dry etching can be eased by placing the interconnection (the interconnection layer 143 of the peripheral circuit unit 40) in the vicinity of the light polarizing unit 110.

Further, the image sensor 1 of the drawing shows an example of the case where the interconnection 33 described in FIG. 10 is further included. The interconnection 33 connects the light polarizing unit 110 and the interconnection layer 143 of the peripheral circuit unit 40.

Otherwise, the configuration of the image sensor 1 is similar to the configuration of the image sensor 1 described in the first embodiment of the present technology, and therefore a description is omitted.

As described above, according to the fourth embodiment of the present technology, also in the front-side illumination image sensor 1, the manufacturing process can be simplified by simultaneously forming the light polarizing unit 110 and the signal transfer unit 20.

5. Fifth Embodiment

The image sensor 1 of the fourth embodiment described above uses the light polarizing unit 110 in a front-side illumination image sensor. In contrast, the image sensor 1 of a fifth embodiment of the present technology differs from the fourth embodiment in that a light blocking unit is further included.

Configuration of Image Sensor

Figure 13:
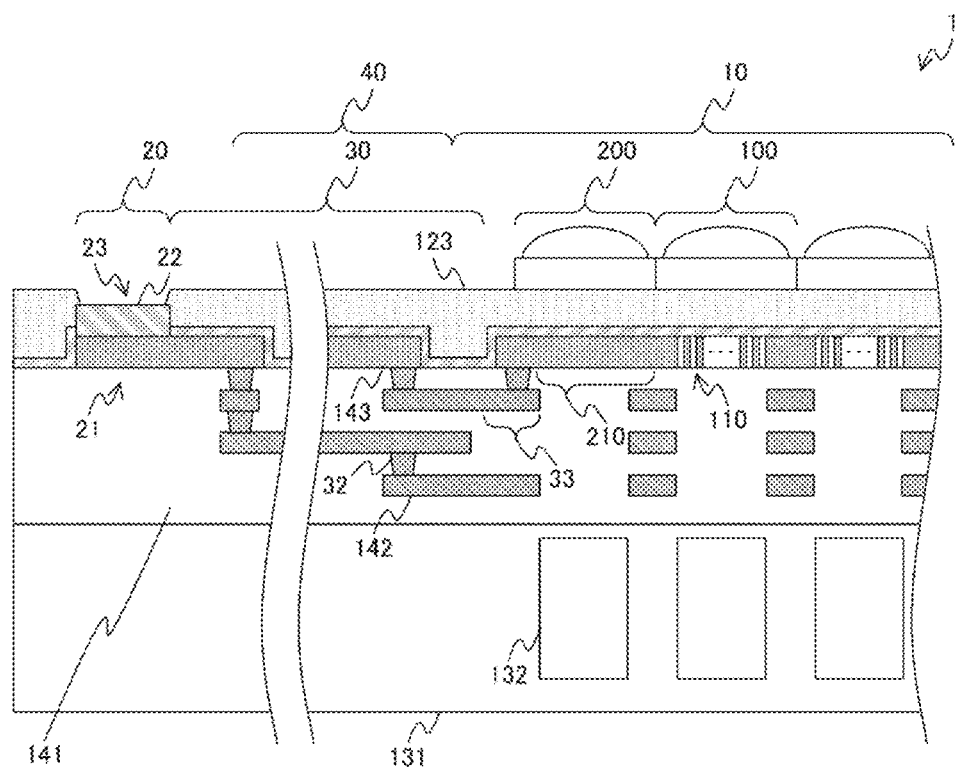
FIG. 13 is a schematic cross-sectional view showing an example of the configuration of an image sensor according to a fifth embodiment of the present technology.

FIG. 13 is a schematic cross-sectional view showing an example of the configuration of an image sensor according to the fifth embodiment of the present technology. The image sensor 1 of the drawing differs from the image sensor 1 described in FIG. 12 in that a light blocking pixel 200 is further included. The light blocking pixel 200 is a pixel in which light from a subject is blocked, and is a pixel used for the measurement of dark current, for example. Here, dark current is a current that flows into the pixel 100 regardless of incident light, and is a current that is superimposed on the image signal and is a cause of noise. Since the image signal generated by the light blocking pixel 200 is a signal corresponding to dark current, dark current can be measured by acquiring a signal from the light blocking pixel 200. The light blocking pixel 200 is placed in an area other than the effective pixel area of the pixel array unit 10. In the drawing, the light blocking pixel 200 is placed in a peripheral portion of the pixel array unit 10.

A light blocking film 210 for light blocking is placed in the light blocking pixel 200 of the drawing. The light blocking film 210 may be configured with the same material as the light blocking line 111 of the light polarizing unit 110, and can be formed simultaneously with the light polarizing unit 110. Further, the drawing shows an example of the case where the light blocking film 210 is connected to the light blocking line 111. Further, the drawing shows an example of the case where the light blocking film 210 is connected to the interconnection layer 143 of the peripheral circuit unit 40 by the interconnection 33.

As described above, the light blocking film 210 is formed simultaneously with the light polarizing unit 110. Specifically, of a light blocking material formed as one film, an ear portion on the outside of the light polarizing unit 110 may be used as the light blocking film 210. In addition, the configuration of the image sensor 1 is not limited to this example. For example, the light blocking film 210 may be placed in a layer different from the light polarizing unit 110, and the light blocking film 210 and the light polarizing unit 110 may be formed by individual processes.

Otherwise, the configuration of the image sensor 1 is similar to the configuration of the image sensor 1 described in the fourth embodiment of the present technology, and therefore a description is omitted.

As described above, according to the fifth embodiment of the present technology, the manufacturing process of the image sensor 1 including a light blocking pixel can be simplified by forming the light blocking film 210 simultaneously with the light polarizing unit 110.

6. Sixth Embodiment

An imaging device in which the image sensor 1 is used will now be described.

Configuration of Imaging Device

Figure 14:
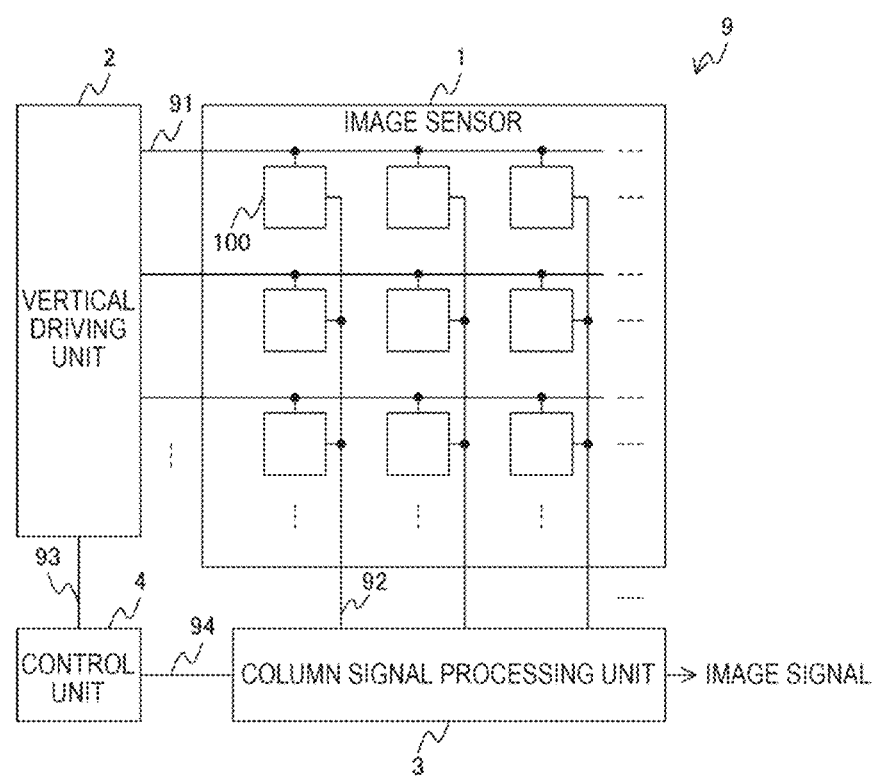
FIG. 14 is a diagram showing an example of the configuration of an imaging device according to an embodiment of the present technology.

FIG. 14 is a diagram showing an example of the configuration of an imaging device according to an embodiment of the present technology. An imaging device 9 of the drawing includes the image sensor 1, a vertical driving unit 2, a column signal processing unit 3, and a control unit 4.

The vertical driving unit 2 generates a control signal of the pixel circuit of the pixel 100. The vertical driving unit 2 transfers the generated control signal to the pixel 100 via a signal line 91 of the drawing. The column signal processing unit 3 processes an image signal generated by the pixel 100. The column signal processing unit 3 performs the processing of an image signal transferred from the pixel 100 via a signal line 92 of the drawing. The processing in the column signal processing unit 3 includes, for example, analog/digital conversion that converts an analog image signal generated in the pixel 100 to a digital image signal. The control unit 4 controls the entire imaging device 9. The control unit 4 generates and outputs control signals that control the vertical driving unit 2 and the column signal processing unit 3, and thereby controls the imaging device 9. The control signal generated by the control unit 4 is transferred to the vertical driving unit 2 and the column signal processing unit 3 by signal lines 93 and 94, respectively.

The image sensor 1 described in the first embodiment of the present technology (the image sensor 1 in FIG. 1) may be used as the image sensor 1 shown in the drawing. In this case, the signal transfer unit 20 and the interconnection 30 described in FIG. 1 configure a part of the signal lines 91 and 92. This similarly applies to the image sensor 1 in the second embodiment and the third embodiment of the present technology.

On the other hand, the image sensor 1 described in the fourth embodiment of the present technology (the image sensor 1 in FIG. 11) may be used by replacing the image sensor 1, the vertical driving unit 2, and the column signal processing unit 3 shown in the drawing. This is because the image sensor 1 in FIG. 11 includes the vertical driving unit 2 and the column signal processing unit 3 as the peripheral circuit unit 40. In this case, the signal transfer unit 20 and the interconnection 30 configure a part of the signal lines 93 and 94. This similarly applies to the image sensor 1 in the fifth embodiment of the present technology.

Configuration of Pixel Circuit

Figure 15:
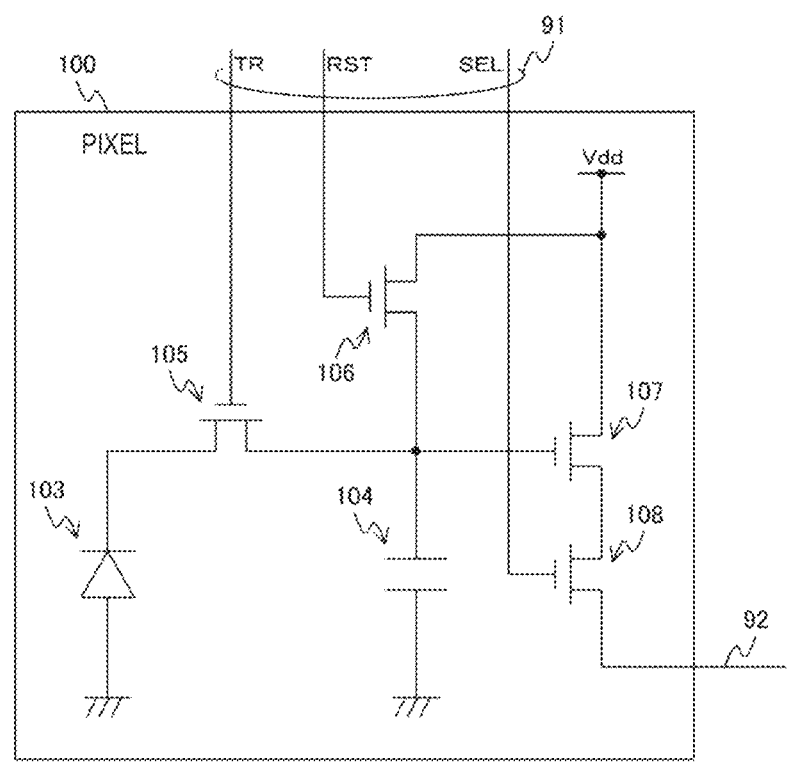
FIG. 15 is s diagram showing an example of the configuration of a pixel circuit according to an embodiment of the present technology.

FIG. 15 is a diagram showing an example of the configuration of a pixel circuit according to an embodiment of the present technology. The pixel 100 of the drawing includes a photodiode 103, a charge retention unit 104, and MOS transistors 105 to 108.

The anode of the photodiode 103 is grounded, and the cathode is connected to the source of the MOS transistor 105. The drain of the MOS transistor 105 is connected to the source of the MOS transistor 106, the gate of the MOS transistor 107, and one end of the charge retention unit 104. The other end of the charge retention unit 104 is grounded. The drains of the MOS transistors 106 and 107 are connected to a power supply line Vdd in common, and the source of the MOS transistor 107 is connected to the drain of the MOS transistor 108. The source of the MOS transistor 108 is connected to the signal line 92. The gates of the MOS transistors 105, 106, and 108 are connected to a transfer signal line TR, a reset signal line RST, and a selection signal line SEL, respectively. The transfer signal line TR, the reset signal line RST, and the selection signal line SEL configure the signal line 91.

The photodiode 103 corresponds to the photodiode configured by the photoelectric conversion unit 132 and the semiconductor substrate 131 described above in FIG. 2. Further, the charge retention unit 104 and the MOS transistors 105 to 108 configure the pixel circuit.

The MOS transistor 105 is a transistor that transfers a charge generated by the photoelectric conversion unit 132 of the photodiode 103 to the charge retention unit 104. The transfer of a charge in the MOS transistor 105 is controlled by a signal transferred by the transfer signal line TR. The charge retention unit 104 is a capacitor that retains the charge transferred by the MOS transistor 105. The MOS transistor 107 is a transistor that generates a signal based on the charge retained in the charge retention unit 104. The MOS transistor 108 is a transistor that is controlled by a signal transferred by the selection signal line SEL and outputs the signal generated by the MOS transistor 107 as an image signal to the signal line 92. The MOS transistor 106 is a transistor that resets the charge retention unit 104 by releasing the charge retained in the charge retention unit 104 to the power supply line Vdd. The reset by the MOS transistor 106 is controlled by a signal transferred by the reset signal line RST, and is executed before a charge is transferred by the MOS transistor 105. Thus, the pixel circuit converts a charge generated by the photoelectric conversion unit 132 to an image signal.

7. Application Example to Endoscopic Surgery System

An embodiment of the technology according to the present disclosure (an embodiment of the present technology) can be applied to various products. For example, an embodiment of the technology according to the present disclosure may be applied to an endoscopic surgery system.

Figure 16:
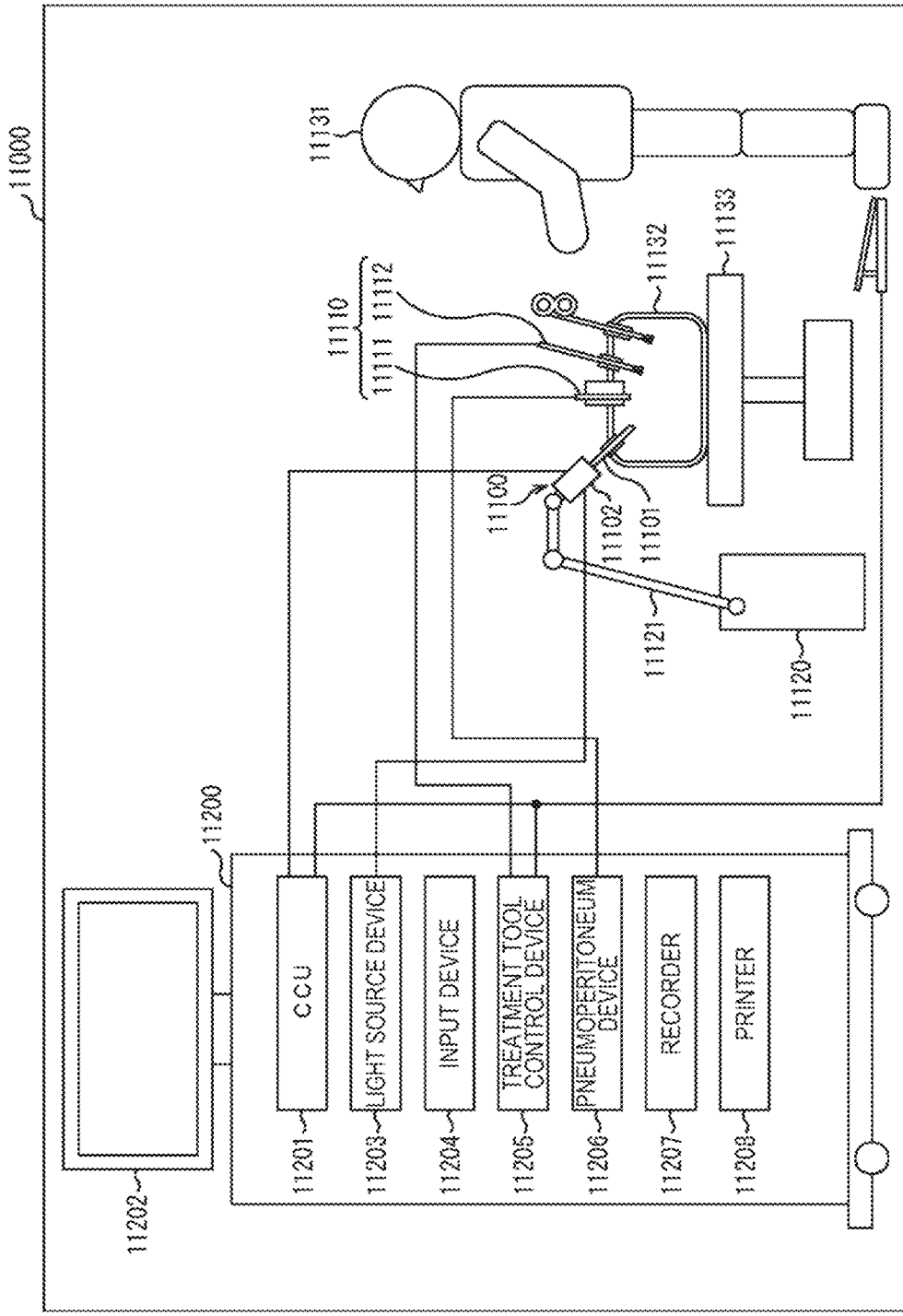
FIG. 16 is a diagram illustrating an example of a schematic configuration of an endoscopic surgery system.

FIG. 16 is a diagram illustrating an example of a schematic configuration of an endoscopic surgery system to which the technology according to an embodiment of the present disclosure is applicable.

FIG. 16 illustrates a situation in which a surgeon (doctor) 11131 is using an endoscopic surgery system 11000 to perform surgery on a patient 11132 lying on a patient bed 11133. As illustrated in the diagram, the endoscopic surgery system 11000 is made up of an endoscope 11100, other surgical instruments 11110, such as a pneumoperitoneum tube 11111, an energy treatment tool 11112 or the like, a support arm apparatus 11120 that supports the endoscope 11100, and a cart 11200 on which various devices for endoscopic surgery are provided.

The endoscope 11100 is made up of a lens tube 11101 having a region of certain length from the front end that is inserted into the body cavity of the patient 11132, and a camera head 11102 connected to the base end of the lens tube 11101. In the example illustrated in the diagram, an endoscope 11100 configured as a so-called rigid scope having a rigid lens tube 11101 is illustrated, but the endoscope 11100 may also be configured as a so-called flexible scope having a flexible lens tube.

On the front end of the lens tube 11101, there is provided an opening into which an objective lens is fitted. A light source device 11203 is connected to the endoscope 11100. Light generated by the light source device 11203 is guided up to the front end of the lens tube 11101 by a light guide extending inside the lens tube 11101, and is radiated through the objective lens towards an observation target inside the body cavity of the patient 11132. Note that the endoscope 11100 may be a forward-viewing scope, an oblique-viewing scope, or a side-viewing scope.

An optical system and an image sensor are provided inside the camera head 11102, and reflected light from the observation target (observation light) is condensed onto the image sensor by the optical system. Observation light is photoelectrically converted by the image sensor, and an electrical signal corresponding to the observation light, or in other words, an image signal corresponding to the observed image, is generated. The image signal is transmitted as RAW data to a camera control unit (CCU) 11201.

The CCU 11201 is made up of components such as a central processing unit (CPU) and a graphics processing unit (GPU), and centrally controls the operation of the endoscope 11100 and the display device 11202. Further, the CCU 11201 receives an image signal from the camera head 11102 and subjects the image signal to various types of image processing for displaying an image based on the image signal, such as development process (demosaicing process), for example.

The display device 11202 displays an image based on the image signal subjected to image processing by the CCU 11201, by control from the CCU 11201.

The light source device 11203 is made up of a light source such as a light-emitting diode (LED), for example, and supplies the endoscope 11100 with irradiating light when imaging the operating site.

An input device 11204 is an input interface with respect to the endoscopic surgery system 11000. Through the input device 11204, the user is able to input various information and instructions into the endoscopic surgery system 11000. For example, the user inputs instructions to change the imaging parameters of imaging by the endoscope 11100

(such as the type of irradiating light, the magnification, and the focus distance), and the like.

A treatment tool control device 11205 controls the driving of the energy treatment tool 11112 to cauterize or make incisions into tissue, seal blood vessels, or the like. The pneumoperitoneum device 11206 delivers gas into the body cavity through the pneumoperitoneum tube 11111 to inflate the body cavity of the patient 11132 for the purpose of securing a field of view for the endoscope 11100 and securing a workspace for the surgeon. The recorder 11207 is a device capable of recording various types of information related to surgery. The printer 11208 is a device capable of printing out various types of information related to surgery in various formats, such as text, images, or graphs.

The light source device 11203, which supplies the endoscope 11100 with irradiating light when imaging the operating site, may be made up of a white light source configured by an LED, a laser light source, or a combination of the two, for example. At this point, in the case in which the white light source is configured by a combination of RGB laser light sources, the output intensity and output timing of each color (each wavelength) can be controlled with high precision, and thus the white balance of the captured image can be adjusted with the light source device 11203. Also, in this case, by irradiating the observation target with laser light from each of the RGB laser light sources in a time-division manner, and controlling the driving of the image sensor of the camera head 11102 in synchronization with the irradiation timings, it is also possible to capture images corresponding to R, G, and B, respectively, in a time-division manner. According to such a method, color images can be obtained without providing the image sensor with a color filter.

Also, the driving of the light source device 11203 may also be controlled so as to change the intensity of the light to output every time a certain amount of time elapses. By controlling the driving of the image sensor of the camera head 11102 in synchronization with the timings of changing the light intensity to acquire images in a time-division manner, and compositing the images together, it is possible to generate a high dynamic range image without what are called crushed blacks and blown-out whites.

Additionally, the light source device 11203 may also be configured to be able to supply light in a certain wavelength band corresponding to special imaging. With special imaging, for example, the wavelength dependency of light absorption by tissues of the body is utilized, and light is radiated in a narrow band compared to the irradiating light during normal observation (that is, white light) to thereby image certain tissues, such as blood vessels in the superficial portion of the mucous membrane, at a high contrast, also known as narrow band imaging (NBI). Alternatively, with special imaging, fluorescent observation that obtains an image with fluorescent light by radiating excitation light may also be conducted. With fluorescent observation, it is possible to irradiate a body tissue with excitation light and observe fluorescent light from the body tissue (autofluorescence observation), or locally inject a reagent such as indocyanine green (ICG) into a body tissue while also irradiating that body tissue with excitation light corresponding to the fluorescence wavelength of the reagent to obtain a fluorescent image, or the like. The light source device 11203 may be configured to be able to supply narrow-band light and/or excitation light corresponding to such special imaging.

Figure 17:
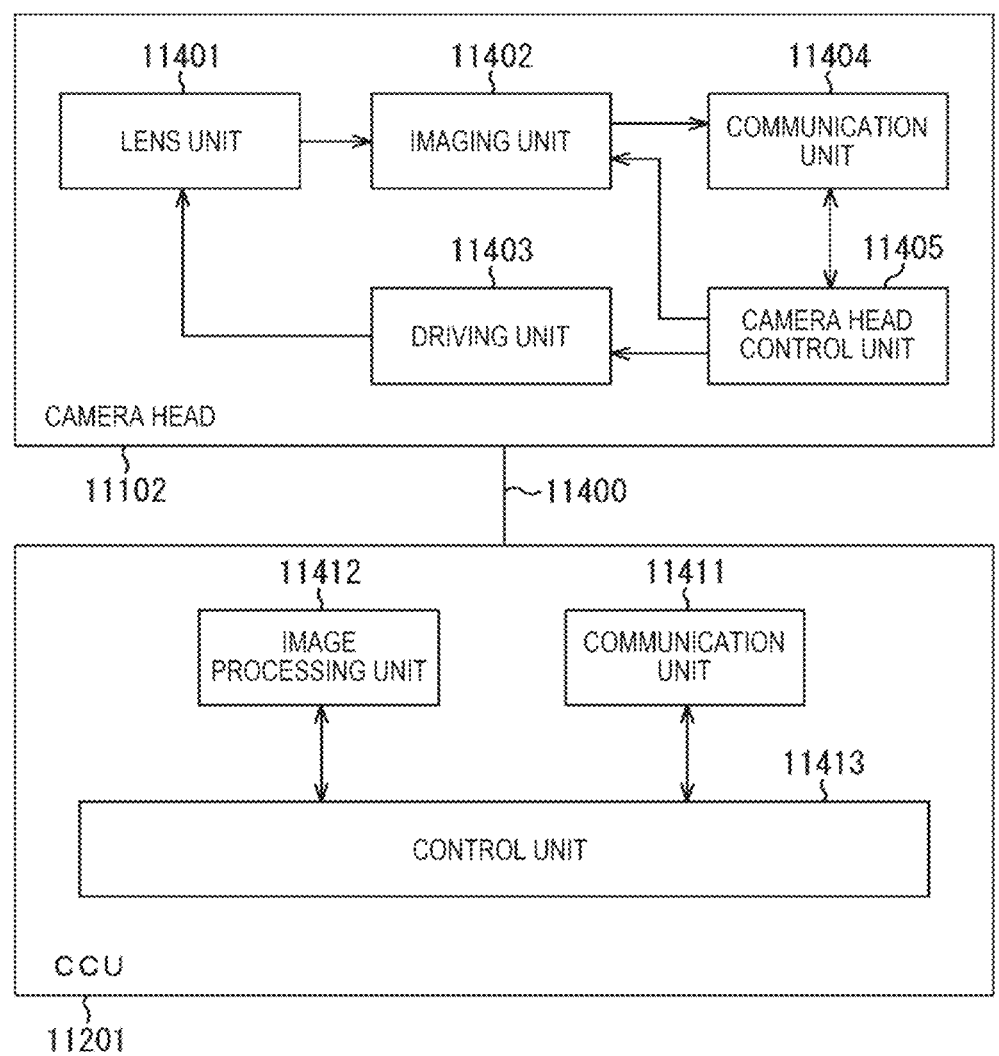
FIG. 17 is a block diagram illustrating an example of a functional configuration of the camera head and the CCU.

FIG. 17 is a block diagram illustrating an example of a functional configuration of the camera head and the CCU illustrated in FIG. 16.

The camera head 11102 includes a lens unit 11401, an imaging unit 11402, a driving unit 11403, a communication unit 11404, and a camera head control unit 11405. Also, the CCU 11201 includes a communication unit 11411, an image processing unit 11412, and a control unit 11413. The camera head 11102 and the CCU 11201 are mutually communicably connected by a transmission cable 11400.

The lens unit 11401 is an optical system provided in the part that connects to the lens tube 11101. Observation light taken in from the front end of the lens tube 11101 is guided up to the camera head 11102, and is incident on the lens unit 11401. The lens unit 11401 is made up of a combination of multiple lenses, including a zoom lens and a focus lens.

The imaging unit 11402 is configured with an image sensor. The number of image sensors configuring the imaging unit 11402 may be one (what is called a single-chip type), or may be plural (what is called a multi-chip type). In a case where the imaging unit 11402 is configured with a multi-chip type, a color image may be obtained by, for example, image signals corresponding to RGB, respectively, being generated by the image sensors and these image signals being synthesized. Alternatively, the image sensor constituting the imaging unit 11402 includes a pair of image sensors for respectively acquiring image signals for the right eye and the left eye corresponding to 3D display. By presenting a 3D display, the surgeon 11131 becomes able to grasp the depth of biological tissue at the operating site more accurately. Note that if the imaging unit 11402 has a multi-chip configuration, the lens unit 11401 likewise is provided with multiple subsystems corresponding to each of the image sensors.

Also, the imaging unit 11402 is not necessarily provided in the camera head 11102. For example, the imaging unit 11402 may also be provided inside the lens tube 11101, directly behind the objective lens.

The driving unit 11403 is made up of actuators, and under control from the camera head control unit 11405, moves the zoom lens and the focus lens of the lens unit 11401 by a certain distance along the optical axis. With this arrangement, the magnification and the focus of the image captured by the imaging unit 11402 may be adjusted appropriately.

The communication unit 11404 is configured with a communication device for transmitting and receiving various pieces of information with the CCU 11201. The communication unit 11404 transmits an image signal obtained from the imaging unit 11402 as RAW data to the CCU 11201 via the transmission cable 11400.

Also, the communication unit 11404 receives from the CCU 11201 a control signal for controlling the driving of the camera head 11102, and provides the control signal to the camera head control unit 11405. The control signal includes information related to imaging parameters, such as information specifying the frame rate of the captured image, information specifying the exposure value during imaging, and/or information specifying the magnification and focus of the captured image, for example.

Note that the above imaging parameters such as the frame rate, the exposure value, the magnification, and the focus or the like may be set appropriately by a user, or may be set automatically by the control unit 11413 of the CCU 11201 on the basis of the acquired image signal. In the latter case, what are called an auto exposure (AE) function, an auto focus (AF) function, and an auto white balance (AWB) function are provided in the endoscope 11100.

The camera head control unit 11405 controls the driving of the camera head 11102 on the basis of a control signal from the CCU 11201 received via the communication unit 11404.

The communication unit 11411 is made up of a communication device for transmitting and receiving various information to and from the camera head 11102. The communication unit 11411 receives an image signal transmitted from the camera head 11102 through the transmission cable 11400.

Also, the communication unit 11411 transmits a control signal for controlling the driving of the camera head 11102 to the camera head 11102. The image signal or the control signal may be transmitted by telecommunication or optical communication.

The image processing unit 11412 performs various pieces of image processing on an image signal that is RAW data transmitted from the camera head 11102.

The control unit 11413 performs various pieces of control concerning the imaging of the operating site etc. performed by the endoscope 11100 and the display of a captured image obtained by the imaging of the operating site etc. For example, the control unit 11413 generates a control signal for controlling the driving of the camera head 11102.

In addition, the control unit 11413 causes the display device 11202 to display a captured image on which the operating site or the like is reflected on the basis of the image signal subjected to image processing by the image processing unit 11412. At this point, the control unit 11413 uses any of various types of image recognition technology to recognize various objects in the captured image. For example, by detecting features such as the edge shapes and colors of objects included in the captured image, the control unit 11413 is able to recognize surgical instruments such as forceps, a specific site of the body, hemorrhaging, mist during usage of the energy treatment tool 11112, and the like. When causing the display device 11202 to display a captured image, the control unit 11413 uses the recognition results to overlay various surgical assistance information onto the image of the operating site. By surgical assistance information being overlaid for display and presented to the surgeon 11131, the burden on the surgeon 11131 can be reduced, and the surgeon 11131 can perform the surgery reliably.

The transmission cable 11400 that connects the camera head 11102 and the CCU 11201 is an electrical signal cable supporting the communication of electrical signals, optical fiber supporting optical communication, or a composite cable of the above.

At this point, in the illustrated example, communication is conducted in a wired manner using the transmission cable 11400, but communication between the camera head 11102 and the CCU 11201 may also be conducted wirelessly.

Hereinabove, an example of the endoscopic surgery system to which an embodiment of the technology according to the present disclosure can be applied is described. An embodiment of the technology according to the present disclosure can be applied to, of the configuration described above, the imaging unit 11402 of the camera head 11102. Specifically, the image sensor 1 of FIG. 1 can be used for the imaging unit 11402. By applying an embodiment of the technology according to the present disclosure to the imaging unit 11402, the surgeon (doctor) 11131 can grasp the shape of the internal organs of the patient 11132 more accurately, and therefore the surgeon can observe the operating site reliably.

In addition, although herein an endoscopic surgery system is described as an example, an embodiment of the technology according to the present disclosure may be applied also to, for example, a microscopic surgery system and the like.

8. Application Example to Mobile Object

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 18:
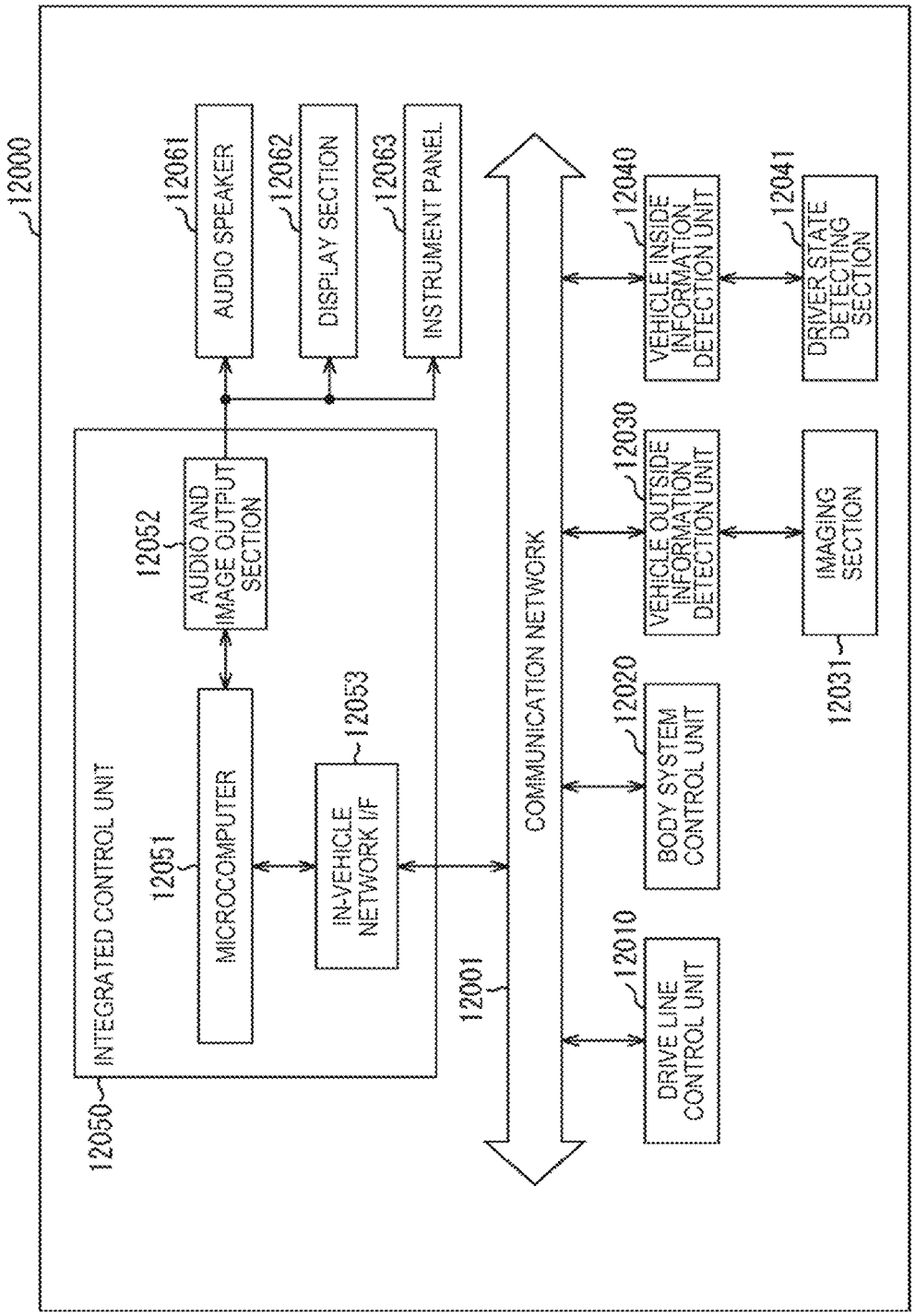
FIG. 18 is a block diagram showing an example of the schematic configuration of a vehicle control system.

FIG. 18 is a block diagram illustrating a schematic configuration example of a vehicle control system which is an example of a mobile object control system to which a technology according to an embodiment of the present technology is applicable.

A vehicle control system 12000 includes a plurality of electronic control units connected via a communication network 12001. In the example illustrated in FIG. 18, the vehicle control system 12000 includes a drive line control unit 12010, a body system control unit 12020, a vehicle outside information detection unit 12030, a vehicle inside information detection unit 12040, and an integrated control unit 12050. In addition, as functional configurations of the integrated control unit 12050, a microcomputer 12051, an audio and image output section 12052, an in-vehicle network interface (I/F) 12053.

The drive line control unit 12010 controls the operation of devices related to the drive line of the vehicle in accordance with a variety of programs. For example, the drive line control unit 12010 functions as a control device for a driving force generating device such as an internal combustion engine or a driving motor that generates the driving force of the vehicle, a driving force transferring mechanism that transfers the driving force to wheels, a steering mechanism that adjusts the steering angle of the vehicle, a braking device that generates the braking force of the vehicle, and the like.

The body system control unit 12020 controls the operations of a variety of devices attached to the vehicle body in accordance with a variety of programs. For example, the body system control unit 12020 functions as a control device for a keyless entry system, a smart key system, a power window device, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 receives these radio waves or signals, and controls the vehicle door lock device, the power window device, the lights, or the like.

The vehicle outside information detection unit 12030 detects information regarding the outside of a vehicle on which the vehicle control system 12000 is mounted. For example, an imaging section 12031 is connected to the vehicle outside information detection unit 12030. The vehicle outside information detection unit 12030 causes the imaging section 12031 to capture an image outside of the vehicle and receives the captured image. The vehicle outside information detection unit 12030 may perform an object detection process or a distance detection process for a person, a vehicle, an obstacle, a sign, letters on a road, or the like on the basis of the received image.

The imaging section 12031 is a light sensor that receives light and outputs an electric signal corresponding to the amount of received light. The imaging section 12031 can output the electric signal as an image or distance measurement information. In addition, the light received by the imaging section 12031 may be the visible light or may be non-visible light such as infrared light.

The vehicle inside information detecting unit 12040 detects information on the inside of the vehicle. The vehicle inside information detecting unit 12040 is connected, for example, to a driver state detecting section 12041 that detects the state of the driver. The driver state detecting section 12041 may include, for example, a camera that images the driver. The vehicle inside information detecting unit 12040 may compute the degree of the driver's tiredness or the degree of the driver's concentration or determine whether the driver have a doze, on the basis of detection information input from the driver state detecting section 12041.

For example, the microcomputer 12051 can calculate a control target value of the driving force generating device, the steering mechanism, or the braking device on the basis of information acquired by the vehicle outside information detecting unit 12030 or the vehicle inside information detecting unit 12040 on the inside and outside of the vehicle, and output a control instruction to the drive line control unit 12010. For example, the microcomputer 12051 may perform cooperative control for the purpose of executing the functions of an advanced driver assistance system (ADAS) including vehicle collision avoidance or impact reduction, follow-up driving based on the inter-vehicle distance, constant vehicle speed driving, vehicle collision warning, vehicle lane departure warning, or the like.

Further, the microcomputer 12051 can control the driving force generating device, the steering mechanism, the braking device, or the like on the basis of information acquired by the vehicle outside information detecting unit 12030 or the vehicle inside information detecting unit 12040 on the areas around the vehicle, thereby performing cooperative control for the purpose of automatic driving or the like that allows the vehicle to autonomously travel irrespective of any operation of a driver.

In addition, the microcomputer 12051 can output a control instruction to the body system control unit 12020 on the basis of the information regarding the outside of the vehicle acquired by the vehicle outside information detection unit 12030. For example, the microcomputer 12051 can control a head lamp in accordance with the position of a preceding vehicle or an oncoming vehicle detected by the vehicle outside information detection unit 12030 and can perform cooperative control for the purpose of anti-glaring such as switching a high beam to a low beam.

The audio and image output section 12052 transmits an output signal of at least one of a sound and an image to an output device capable of visually or aurally notifying a passenger of the vehicle or the outside of the vehicle of information. In the example of FIG. 18, an audio speaker 12061, a display section 12062, and an instrument panel 12063 are exemplified as the output device. For example, the display section 12062 may include at least one of an onboard display and a head-up display.

Figure 19:
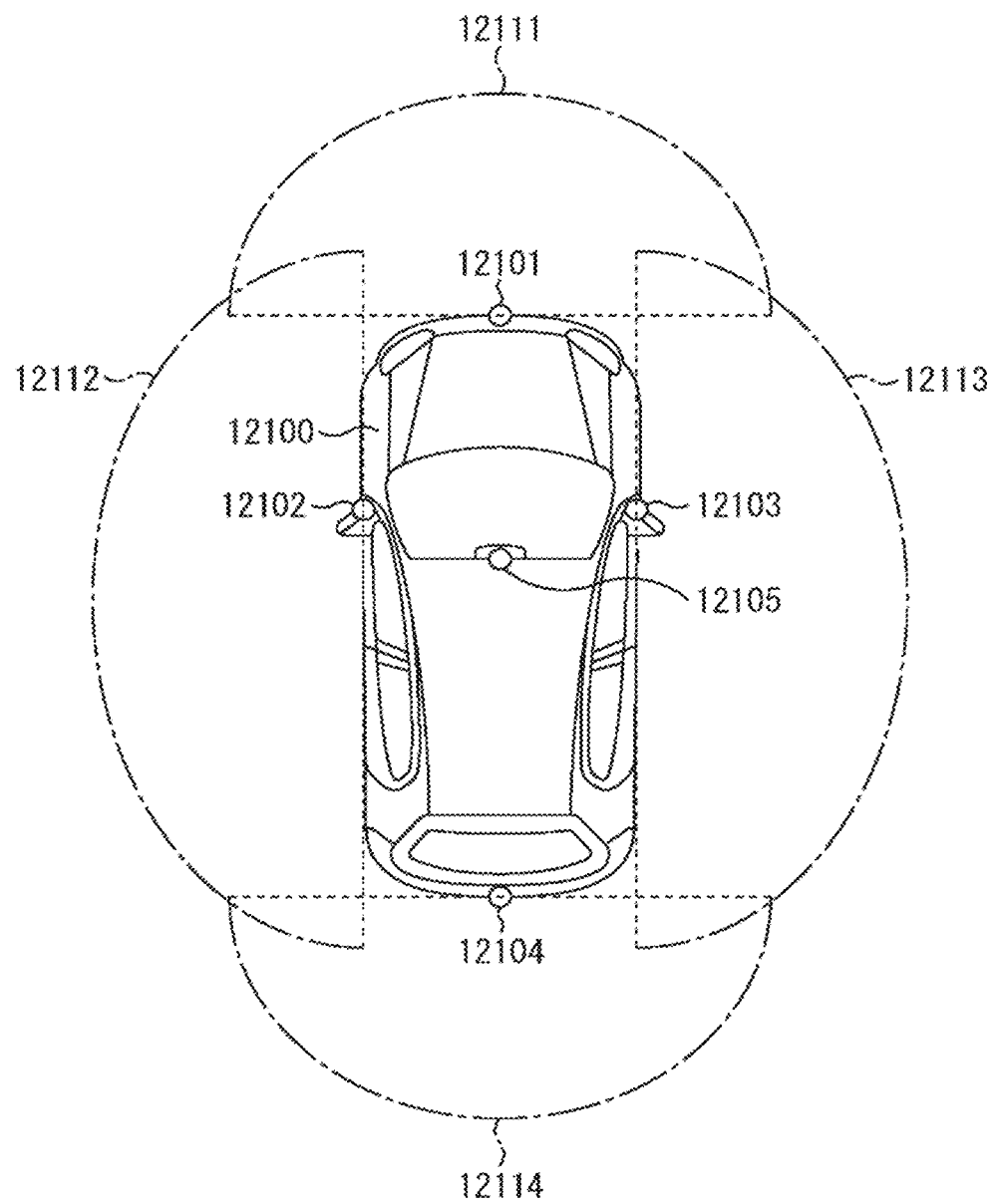
FIG. 19 is an explanatory diagram showing an example of the installation position of a vehicle outside information detection unit and an imaging unit.

FIG. 19 is a diagram illustrating an example of an installation position of the imaging section 12031.

In FIG. 19, the vehicle 12100 includes imaging sections 12101, 12102, 12103, 12104, and 12105 as the imaging section 12031.

Imaging sections 12101, 12102, 12103, 12104, and 12105 are positioned, for example, at the front nose, a side mirror, the rear bumper, the back door, and the upper part of the windshield in the vehicle compartment of a vehicle 12100. The imaging section 12101 attached to the front nose and the imaging section 12105 attached to the upper part of the windshield in the vehicle compartment chiefly acquire images of the area ahead of the vehicle 12100. The imaging sections 12102 and 12103 attached to the side mirrors chiefly acquire images of the areas on the sides of the vehicle 12100. The imaging section 12104 attached to the rear bumper or the back door chiefly acquires images of the area behind the vehicle 12100. The image of the front side obtained by the imaging sections 12101 and 12105 is used chiefly to detect a preceding vehicle, a pedestrian, an obstacle, a traffic light, a traffic sign, a lane, or the like.

Additionally, FIG. 19 illustrates an example of the imaging ranges of the imaging sections 12101 to 12104. An imaging range 12111 represents the imaging range of the imaging section 12101 attached to the front nose. Imaging ranges 12112 and 12113 respectively represent the imaging ranges of the imaging sections 12102 and 12103 attached to the side mirrors. An imaging range 12114 represents the imaging range of the imaging section 12104 attached to the rear bumper or the back door. For example, overlaying image data captured by the imaging sections 12101 to 12104 offers an overhead image that looks down on the vehicle 12100.

At least one of the imaging sections 12101 to 12104 may have a function of acquiring distance information. For example, at least one of the imaging sections 12101 to 12104 may be a stereo camera including a plurality of image sensors or may be an image sensor that includes pixels for phase difference detection.

For example, the microcomputer 12051 can extract a 3-dimensional object traveling at a predetermined speed (for example, 0 or more km/h) in substantially the same direction as the vehicle 12100 as a preceding vehicle by particularly using a closest 3-dimensional object on a travel road of the vehicle 12100 by obtaining a distance to each 3-dimensional object within the imaging ranges 12111 to 12114 and a temporal change in the distance (a relative speed to the vehicle 12100) on the basis of distance information obtained from the imaging sections 12101 to 12104. Further, the microcomputer 12051 can set an inter-vehicle distance to be ensured in advance before a preceding vehicle and perform automatic brake control (also including follow-up stop control) or automatic acceleration control (also including follow-up oscillation control). In this way, it is possible to perform cooperative control for the purpose of automatic driving or the like that allows the vehicle to autonomously travel irrespective of any operation of a driver.

For example, the microcomputer 12051 can classify and extract 3-dimensional object data regarding 3-dimensional objects as other 3-dimensional objects such as motorcycles, normal vehicles, large vehicles, pedestrians, and electric poles on the basis of the distance information obtained from the imaging sections 12101 to 12104 and can use the other 3-dimensional objects to automatically avoid obstacles. For example, the microcomputer 12051 identifies obstacles around the vehicle 12100 as obstacles which can be viewed by a driver of the vehicle 12100 and obstacles which are difficult to view. Then, the microcomputer 12051 can determine a collision risk indicating a danger of collision with each obstacle and output a warning to the driver via the audio speaker 12061 or the display section 12062 in a situation in which there is a collision possibility since the collision risk is set to be equal to or greater than a set value or can perform driving assistance for collision avoidance by performing forced deceleration or avoidance steering iv via the drive line control unit 12010.

At least one of the imaging sections 12101 to 12104 may be an infrared camera that detects infrared light. For example, the microcomputer 12051 can recognize a pedestrian by determining whether there is the pedestrian in captured images of the imaging sections 12101 to 12104. The pedestrian can be recognized, for example, in a procedure in which feature points are extracted in the captured images of the imaging sections 12101 to 12104 serving as infrared cameras and a procedure in which a series of feature points indicating a contour of an object are subjected to a pattern matching process to determine whether there is the pedestrian. The microcomputer 12051 determines that there is the pedestrian in the captured images of the imaging sections 12101 to 12104. When the pedestrian is recognized, the audio and image output section 12052 controls the display section 12062 such that a rectangular contour line for emphasis is superimposed to be displayed on the recognized pedestrian. In addition, the audio and image output section 12052 controls the display section 12062 such that an icon or the like indicating the pedestrian is displayed at a desired position.

The example of the vehicle control system to which an embodiment of the technology according to the present disclosure can be applied has been described above. An embodiment of the technology according to the present disclosure can be applied to the imaging section 12031 in the above-described configuration. Specifically, the image sensor 1 of FIG. 1 can be used for the imaging unit 12031. By applying an embodiment of the technology according to the present disclosure to the imaging unit 12031, the shape of a road surface can be grasped more accurately, and therefore safety during driving can be improved.

Lastly, the descriptions of the embodiments described above are examples of the present technology, and the present technology is not limited to the embodiments described above. Thus, for embodiments other than those described above, various alterations are possible in accordance with the design etc. without departing from the technical idea according to embodiments of the present technology, as a matter of course.

Additionally, the present technology may also be configured as below.

(1)

An image sensor, comprising:
a plurality of pixels, each pixel including:
a photoelectric conversion unit;
a light polarizing unit;
a pixel circuit; and
a plurality of signal transfer units, wherein at least a portion of the light polarizing unit and at least a portion of the signal transfer units are at a same layer of the image sensor.

(2)

The image sensor of (1), wherein the light polarizing unit includes a plurality of light blocking lines having a pitch narrower than a wavelength included in incident light.

(3)

The image sensor of (1) or (2), further comprising:
a semiconductor substrate, wherein the photoelectric conversion unit is formed in the semiconductor substrate; and
a first flattening film, wherein the light blocking lines and the signal transfer units are formed on the first flattening film.

(4)

The image sensor of (2) or (3), wherein the light blocking lines are arranged at equal intervals, and wherein areas between adjacent light blocking lines within a pixel are filled with air.

(5)

The image sensor of claim any of (2) to (4), further comprising:
a protection film on a light incident side of the light blocking lines, wherein the protection film seals the areas between adjacent light blocking lines.

(6)

The image sensor of any of (2) to (5), wherein the light blocking lines and the signal transfer units are formed from aluminum.

(7) The image sensor of any of (1) to (6), further comprising:
an interconnection layer on a side of the semiconductor substrate opposite a light incident side;
a plurality of via plugs; and
an interconnection included as part of each of the signal transfer units, wherein the interconnection layer is connected to each of the signal transfer units by a respective via plug and a respective interconnection, and wherein the image sensor is a back-side illumination image sensor.

(8)

The image sensor of any of (1) to (6), further comprising:
an interconnection layer between a light incident side of the semiconductor substrate and the light polarizing units of the pixels, wherein the image sensor is a front-side illumination image sensor.

(9)

The image sensor of any of (2) to (8), wherein the light blocking lines are formed from a plurality of layers of material, and wherein a first one of the plurality of layers of material of the light blocking lines also forms the at least a portion of the signal transfer units.

(10)

The image sensor of (9), wherein the first one of the plurality of layers of material is a light reflecting layer, wherein a second one of the plurality of layers of material is an insulating layer, and wherein a third one of the plurality of layers of material is a light absorbing layer.

(11)

The image sensor of any of (1) to (10), wherein a first pixel of the plurality of pixels includes a light polarizing unit with light blocking lines arranged in a first direction, and wherein a second pixel of the plurality of pixels includes a light polarizing unit with light blocking lines arranged in a second direction.

(12)

The image sensor of (11), wherein the first direction is shifted by 45 degrees compared to the second direction.

(13)

The image sensor of any of (1) to (12), wherein the pixels are arranged in groups of four pixels, wherein each of the pixels in a selected group has light blocking lines arranged in a different direction.

(14)

The image sensor of (13), further comprising:
a plurality of color filters, wherein each of the pixels in the selected group includes a color filter that transmits light of a same color.

(15)
An image sensor, comprising:
a substrate;
a photoelectric conversion unit formed in the substrate;
a light polarizing unit on a light incident side of the substrate; and
a signal transfer unit on the light incident side of the substrate, wherein the light polarizing unit and the photoelectric conversion unit are formed at a same layer of the image sensor.

(16)
A method of forming an image sensor, comprising:
providing a substrate;
forming a first flattening film on a light incident side of the substrate;
forming a light blocking material on the first flattening film; and
forming a plurality of light blocking lines and at least a first signal transfer unit from the light blocking material.

(17)
The method of (16), wherein forming the plurality of light blocking lines and the at least a first signal transfer unit from the light blocking material includes etching the light blocking material.

(18)
The method of (17), wherein the etching is dry etching.

(19)
The method of any of (16) to (18), wherein the plurality of light blocking lines and the at least a first signal transfer unit are formed simultaneously.

(20)
The method of any of (16) to (19), wherein the light blocking material is a metal.

(21)
An image sensor including:
a light polarizing unit configured to transmit light in a specific light polarization direction out of incident light;
a pixel configured to generate an image signal corresponding to the light transmitted through the light polarizing unit; and
a signal transfer unit formed simultaneously with the light polarizing unit and configured to transfer either of the image signal and a control signal that controls generation of the image signal.

(22)
The image sensor according to (21),
in which the light polarizing unit is configured with a wire grid.

(23)
The image sensor according to (21) or (22),
in which the signal transfer unit is configured with a pad.

(24)
The image sensor according to any of (21) to (23),
in which a part of the signal transfer unit is formed simultaneously with the light polarizing unit.

(25)
The image sensor according to any of (21) to (24), further including:
a protection film configured to protect the light polarizing unit,
in which the signal transfer unit is configured by removal of the protection film formed in an area adjacent to a surface of the signal transfer unit on which the light is incident.

(26)
The image sensor according to any of (21) to (25), further including:
an interconnection formed simultaneously with the light polarizing unit and configured to connect the signal transfer unit and the pixel together.

(27)
The image sensor according to any of (21) to (26), further including:
a connection unit formed simultaneously with the light polarizing unit and configured to connect the signal transfer unit and the light polarizing unit together.

(28)
A method for manufacturing an image sensor, the method including:
simultaneously forming
a light polarizing unit configured to transmit light in a specific light polarization direction out of incident light and
a signal transfer unit configured to transfer either of an image signal generated in accordance with the light transmitted through the light polarizing unit and a control signal that controls generation of the image signal
on a substrate on which a pixel configured to perform generation of the image signal is formed.

REFERENCE SIGNS LIST 1 image sensor
2 vertical driving unit
3 column signal processing unit
4 control unit
9 imaging device
10 pixel array
20 signal transfer unit
21 first signal transfer unit
22 second signal transfer unit
30, 33 interconnection
40 peripheral circuit unit
91 to 94 signal line
100 pixel
110 light polarizing unit
111 light blocking line
112 area
113 light absorbing layer
114, 141 insulating layer
115 light reflecting layer
121 on-chip lens
122 color filter
123 second flattening film
124 protection film
125 first flattening film
131 semiconductor substrate
132 photoelectric conversion unit
142, 143 interconnection layer
200 light blocking pixel
210 light blocking film
11402, 12031, 12101 to 12105 imaging unit

The invention claimed is:
1. An image sensor, comprising:
a plurality of pixels, each pixel including:
a photoelectric conversion unit;
a light polarizing unit, wherein the light polarizing unit includes a plurality of light blocking lines; and
a pixel circuit; and
a plurality of signal transfer units, wherein the plurality of signal transfer units are arranged in a peripheral portion of the image sensor.

2. The image sensor of claim 1, wherein the plurality of light blocking lines have a pitch narrower than a wavelength included in incident light.

3. The image sensor of claim 1, wherein at least a portion of the light polarizing unit and at least a portion of the plurality of signal transfer units are at a same layer of the image sensor.

4. The image sensor of claim 1, wherein the light polarizing unit and the photoelectric conversion unit are formed at a same layer of the image sensor.

5. The image sensor of claim 1, further comprising:
a first flattening film, wherein the plurality of light blocking lines and the plurality of signal transfer units are formed on the first flattening film.

6. The image sensor of claim 1, wherein the plurality of light blocking lines are arranged at equal intervals, and wherein areas between adjacent light blocking lines within a pixel are filled with air.

7. The image sensor of claim 6, further comprising:
a protection film on a light incident side of the plurality of light blocking lines, wherein the protection film seals the areas between the adjacent light blocking lines.

8. The image sensor of claim 1, wherein the plurality of light blocking lines and the plurality of signal transfer units are formed from aluminum.

9. The image sensor of claim 1, further comprising:
an interconnection layer on a side of a semiconductor substrate opposite a light incident side;
a plurality of via plugs; and
an interconnection included as part of each of the plurality of signal transfer units, wherein the interconnection layer is connected to each of the plurality of signal transfer units by a respective via plug and a respective interconnection, and wherein the image sensor is a back-side illumination image sensor.

10. The image sensor of claim 1, further comprising:
an interconnection layer between a light incident side of a semiconductor substrate and the light polarizing unit of each pixel, wherein the image sensor is a front-side illumination image sensor.

11. The image sensor of claim 1, wherein the plurality of light blocking lines are formed from a plurality of layers.

12. The image sensor of claim 11, wherein a first one of the plurality of layers is a light reflecting layer, wherein a second one of the plurality of layers is an insulating layer, and wherein a third one of the plurality of layers is a light absorbing layer.

13. The image sensor of claim 1, wherein a first pixel of the plurality of pixels includes a first light polarizing unit with first light blocking lines arranged in a first direction, wherein a second pixel of the plurality of pixels includes a second light polarizing unit with second light blocking lines arranged in a second direction, and wherein the first pixel is adjacent to the second pixel.

14. The image sensor of claim 13, wherein the first direction is shifted by 45 degrees compared to the second direction.

15. The image sensor of claim 1, wherein the plurality of pixels are arranged in groups of four pixels, wherein each pixel in a respective group has light blocking lines arranged in a different direction.

16. The image sensor of claim 15, further comprising:
a plurality of color filters, wherein each pixel in a respective group includes a color filter that transmits light of a same color.

17. The image sensor of claim 1, further comprising:
a light blocking pixel used for measurement of dark current.

18. The image sensor of claim 1, further comprising:
a peripheral circuit unit.

19. The image sensor of claim 1, wherein the image sensor comprises a front-side illumination image sensor.

20. An image sensor, comprising:
a substrate;
a photoelectric conversion unit formed in the substrate;
a light polarizing unit on a light incident side of the substrate wherein the light polarizing unit includes a plurality of light blocking lines; and
a signal transfer unit on the light incident side of the substrate, wherein the signal transfer unit is arranged in a peripheral portion of the image sensor.

* * * * *